US012602080B2

(12) United States Patent
Yamada et al.

(10) Patent No.: US 12,602,080 B2
(45) Date of Patent: Apr. 14, 2026

(54) STACKED BODY FOR FLEXIBLE DISPLAY DEVICE, STACKED BODY FOR DISPLAY DEVICE AND FLEXIBLE DISPLAY DEVICE

(71) Applicant: DAI NIPPON PRINTING CO., LTD., Tokyo (JP)

(72) Inventors: Keisuke Yamada, Tokyo (JP); Jun Sato, Tokyo (JP); Saori Kawaguchi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 709 days.

(21) Appl. No.: 17/905,723

(22) PCT Filed: Mar. 9, 2021

(86) PCT No.: PCT/JP2021/009226
§ 371 (c)(1),
(2) Date: Feb. 1, 2023

(87) PCT Pub. No.: WO2021/182453
PCT Pub. Date: Sep. 16, 2021

(65) Prior Publication Data

US 2023/0301046 A1 Sep. 21, 2023

(30) Foreign Application Priority Data

Mar. 9, 2020 (JP) ................................ 2020-040334

(51) Int. Cl.

| | |
|---|---|
| ***G06F 1/16*** | (2006.01) |
| ***H05K 5/03*** | (2006.01) |
| ***H05K 9/00*** | (2006.01) |

(52) U.S. Cl.
CPC ............ *G06F 1/1652* (2013.01); *H05K 5/03* (2013.01); *H05K 9/0067* (2013.01)

(58) Field of Classification Search
CPC .... G06F 1/1652; G06F 1/1637; G06F 1/1641; H05K 5/03; H05K 9/0067; B32B 7/025;
(Continued)

(56) References Cited

U.S. PATENT DOCUMENTS

2016/0152861 A1 6/2016 Matsuo et al.
2016/0194448 A1 7/2016 Song et al.
(Continued)

FOREIGN PATENT DOCUMENTS

JP 2010-285480 12/2010
JP 2016-125063 7/2016
(Continued)

*Primary Examiner* — Nathan L Van Sell
(74) *Attorney, Agent, or Firm* — HSML P.C.

(57) ABSTRACT

The present disclosure provides a stacked body for a flexible display device comprising a substrate layer, and an antistatic layer, wherein a surface resistance of an antistatic layer side surface of the stacked body for a flexible display device is $9\times10^{13}\Omega/\square$ or less; and a surface resistance of the antistatic layer side surface of the stacked body for a flexible display device after an eraser test is $9\times10^{13}\Omega/\square$ or less, wherein, in the eraser test, the antistatic layer side surface of the stacked body for a flexible display device is rubbed with a 6 mm diameter eraser, for 2500 strokes, applying a load of 9.8 N.

13 Claims, 4 Drawing Sheets

(58) Field of Classification Search
CPC .. G02B 1/14; G02B 1/16; H05B 33/02; G09F 9/301; H05F 1/02; H10K 59/871
See application file for complete search history.

(56) References Cited

U.S. PATENT DOCUMENTS

| | | | | |
|---|---|---|---|---|
| 2018/0024592 | A1 | 1/2018 | Lim et al. | |
| 2018/0257351 | A1 | 9/2018 | Yamazaki et al. | |
| 2019/0196077 | A1 | 6/2019 | Kim et al. | |
| 2020/0257338 | A1* | 8/2020 | Park | G02B 1/14 |

FOREIGN PATENT DOCUMENTS

| | | | |
|---|---|---|---|
| JP | 6140348 | B2 | 5/2017 |
| JP | 2017-097322 | | 6/2017 |
| JP | 2017-156508 | | 9/2017 |
| JP | 2018-013785 | | 1/2018 |
| KR | 10-2018-0032195 | | 3/2018 |
| KR | 10-2018-0086137 | | 7/2018 |
| TW | I889773 | | 7/2025 |
| WO | 2015/008777 | | 1/2015 |
| WO | 2018/180304 | | 10/2018 |

* cited by examiner

STACKED BODY FOR FLEXIBLE DISPLAY DEVICE, STACKED BODY FOR DISPLAY DEVICE AND FLEXIBLE DISPLAY DEVICE

TECHNICAL FIELD

The present disclosure relates to a stacked body for a flexible display device, a stacked body for a display device, and a flexible display device.

BACKGROUND ART

For example, a stacked body provided with a functional layer having various properties such as a hard coating property, a scratch resistance, antireflection property, an antiglare property, an antistatic property, and an antifouling property, is placed on the surface of a display device.

As a substrate layer for such a stacked body, for example, a glass substrate and a resin substrate are used. However, the glass substrate and resin substrate are highly insulating, so they are easily electrified, and become dirty due to adhesion of dust and dirt, for example. Also, when static electricity is generated in the production process of a display device, so-called electrostatic breakdown may occur, in which the electronic components constituting the display device are damaged by the charged static electricity being discharged. Also, there is a possibility that display device is electrified when a device such as a battery is installed to the display device. Therefore, it is conventionally known to use a stacked body including an antistatic layer in order to prevent such electrification.

In recent years, not only smart phones and tablet terminals but also display devices such as notebook type personal computers have a touch function. In a display device having a touch function, abrasion resistance and sliding property are required since they are operated by directly touching the surface thereof with a finger or the like.

Also, portable display devices such as smart phones and tablet terminals may be stored in, for example, pockets of clothing or a bag so that the surface of the display devices may be rubbed with the cloth of the clothing or a bag, or with other items stored in the pockets of clothing or a bag. For this reason, further abrasion resistance is required for the portable display devices.

CITATION LIST

Patent Documents

Patent Document 1: Japanese Patent Application Laid-Open (JP-A) No. 2016-125063
Patent Document 2: Japanese Patent No. 6140348

SUMMARY OF DISCLOSURE

Technical Problem

In recent years, flexible displays such as a foldable display, a rollable display, and a bendable display have been attracting attention, and a stacked body placed on the surface of the flexible display has been actively developed. For example, a use of a resin substrate instead of a glass substrate has been studied, and for example, Patent Document 1 proposes a display device window film comprising a plastic substrate having high hardness and excellent optical properties, and a hard coating layer placed on at least one surface of the plastic substrate.

Since flexible displays are used or stored in a bent condition, for example, the surface of the bent portion is likely to be rubbed. Therefore, in the flexible display, further superior abrasion resistance is required in the bent portion.

Generally, examples of a known approach to increase the abrasion resistance may include an increase of the surface hardness, and a decrease of the friction coefficient.

However, in a case where the surface hardness is increased, in a stacked body used for a flexible display, when the surface hardness is increased, flexibility such as folding property (foldable), winding property (rollable), and bending property (bendable) may be impaired.

Also, as a method for reducing the friction coefficient, for example, a technique of imparting low friction property by applying a fluorine based surface treatment agent or by adding a fluorine based additive is known. For example, Patent Document 2 discloses a surface treatment agent including a fluorooxyalkylene group-containing polymer composition capable of providing a coating excellent in water repellency-oil repellency, scratch resistance, low dynamic friction, and abrasion resistance.

However, since the surface of the functional layer is rubbed, the component included in the functional layer in the stacked body may be rubbed away, or the functional layer may be worn down, so that the performance of the functional layer may be deteriorated. Therefore, as described above, further improvement in abrasion resistance is desired in the flexible display.

The present disclosure has been made in view of the above circumstances, and a main object of the present disclosure is to provide a stacked body for a flexible display device, stacked body for a display device, and a flexible display device excellent in abrasion resistance.

Solution to Problem

In order to solve the problems, the inventors of the present disclosure have carried out intensive studies on the abrasion resistance of the stacked body for a flexible display device. As the results, they have surprisingly and newly found out that the abrasion resistance and the surface resistance are correlated with each other. The present disclosure is based on such findings.

One embodiment of the present disclosure provides a stacked body for a flexible display device comprising a substrate layer, and an antistatic layer, wherein a surface resistance of an antistatic layer side surface of the stacked body for a flexible display device is $9\times10^{13}\Omega/\square$ or less; and a surface resistance of the antistatic layer side surface of the stacked body for a flexible display device after an eraser test is $9\times10^{13}\Omega/\square$ or less, wherein, in the eraser test, the antistatic layer side surface of the stacked body for a flexible display device is rubbed with a 6 mm diameter eraser, for 2500 strokes, applying a load of 9.8 N.

In the stacked body for a flexible display device in the present disclosure, a ratio of the surface resistance of the antistatic layer side surface of the stacked body for a flexible display device after the eraser test, with respect to an initial surface resistance, is preferably 20.0 or less.

Also, in the stacked body for a flexible display device in the present disclosure, a functional layer may be included on an antistatic layer surface side of the substrate layer.

Also, in the stacked body for a flexible display device in the present disclosure, the antistatic layer is preferably placed on an outermost surface.

Also, in the stacked body for a flexible display device in the present disclosure, an impact absorbing layer may be included on a surface of the substrate layer, on an opposite surface side to the antistatic layer, or between the substrate layer and the antistatic layer.

Also, in the stacked body for a flexible display device in the present disclosure, an adhesive layer for adhesion may be included on a surface of the substrate layer, on an opposite surface side to the antistatic layer.

Another embodiment of the present disclosure provides a stacked body for a display device comprising a substrate layer, and an antistatic layer, wherein a surface resistance of an antistatic layer side surface of the stacked body for a display device is $9\times10^{13}\Omega/\square$ or less; and a surface resistance of the antistatic layer side surface of the stacked body for a display device after an eraser test is $9\times10^{13}\Omega/\square$ or less, wherein, in the eraser test, the antistatic layer side surface of the stacked body for a display device is rubbed with a 6 mm diameter eraser, for 2500 strokes, applying a load of 9.8 N.

Another embodiment of the present disclosure provides a flexible display device comprising: a display panel, and the stacked body for a flexible display device described above placed on an observer side of the display panel.

Advantageous Effects of Disclosure

The present disclosure has an effect that a stacked body for a flexible display device, a stacked body for a display device, and a flexible display device excellent in abrasion resistance may be provided.

DESCRIPTION OF EMBODIMENTS

Figure 1:
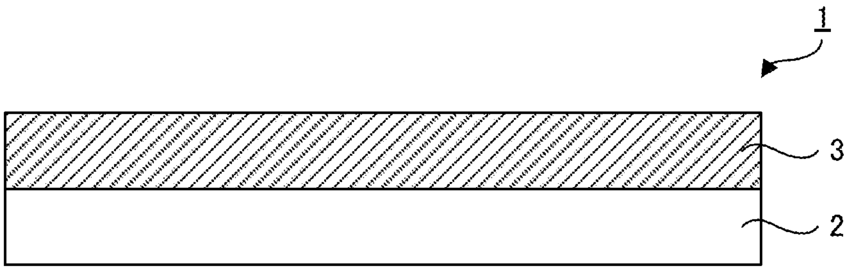
FIG. 1 is a schematic cross-sectional view illustrating an example of a stacked body for a flexible display device in the present disclosure.

Embodiments in the present disclosure are hereinafter explained with reference to, for example, drawings. However, the present disclosure is enforceable in a variety of different forms, and thus should not be taken as is limited to the contents described in the embodiments exemplified as below. Also, the drawings may show the features of the present disclosure such as width, thickness, and shape of each part schematically comparing to the actual form in order to explain the present disclosure more clearly in some cases; however, it is merely an example, and thus does not limit the interpretation of the present disclosure. Also, in the present description and each drawing, for the factor same as that described in the figure already explained, the same reference sign is indicated and the detailed explanation thereof may be omitted.

In the present descriptions, in expressing an aspect wherein some member is placed on the other member, when described as merely "on" or "below", unless otherwise stated, it includes both of the following cases: a case wherein some member is placed directly on or directly below the other member so as to be in contact with the other member, and a case wherein some member is placed on the upper side or the lower side of the other member via yet another member. Also, in the present descriptions, on the occasion of expressing an aspect wherein some member is placed on the surface of the other member, when described as merely "on the surface side" or "on the surface", unless otherwise stated, it includes both of the following cases: a case wherein some member is placed directly on or directly below the other member so as to be in contact with the other member, and a case wherein some member is placed on the upper side or the lower side of the other member via yet another member.

As the result of intensive studies on the abrasion resistance of the stacked body for a flexible display device, the inventors of the present disclosure have found out the following knowledges.

Generally, examples of a known approach to increase the abrasion resistance may include an increase of the surface hardness, and a decrease of the friction coefficient.

However, in a case of increasing the surface hardness, in a stacked body for a flexible display device, the flexibility may be deteriorated when the surface hardness is increased. Therefore, the approach of increasing the surface hardness is not suitable for the stacked body for a flexible display device.

Also, in a case of decreasing the friction coefficient, the following techniques for imparting a low friction property are known; for example, applying a fluorine based surface treating agent, and adding a fluorine based additive. However, when the stacked body for a flexible display device includes a functional layer having various performances, for example, since the surface of the functional layer is rubbed, the component included in the functional layer may be rubbed away, or the functional layer may be worn down, so that the performance of the functional layer may be deteriorated.

Thus, firstly, the inventors of the present disclosure have studied about the variation of friction force before and after the abrasion test by preparing a stacked body for a flexible display device including a substrate layer and a functional layer, and carrying out an abrasion test to the stacked body for a flexible display device. By focusing on the eraser test and the surface resistance, and measuring the friction force and the surface resistance before and after the eraser test, they have found out that, although both of the friction force and the surface resistance tend to increase after the eraser test as compared to before the eraser test, the variation of the friction force before and after the eraser test tends to be relatively low, when the surface resistance after the eraser test is relatively low; and when the surface resistance after the eraser test is relatively high, the variation of the friction force before and after the eraser test tends to be relatively high. Further, they have found out that, when the initial surface resistance before the eraser test is low, the surface resistance after the eraser test tends to be low. That is, they have found out that the abrasion resistance and the surface resistance after the eraser test are correlated with each other. Further, they have found out that the abrasion resistance may be easily inferred from the initial surface resistance before the eraser test. In other words, they have newly found out that the abrasion resistance and the surface resistance before and after the eraser test are well correlated with each other. Further, by studying the correlation between the abrasion resistance and the surface resistance before and after the eraser test in detail, they have found out that, in order to impart excellent abrasion resistance, it is importance to make the surface resistance before and after the eraser test to be a predetermined value or less.

In the present disclosure, it is very meaningful to find out the decrease of the surface resistance after an eraser test as an index of improving the abrasion resistance. Further, it is very meaningful to find out the initial surface resistance before an eraser test as an index to infer the abrasion resistance.

Here, the reason for using an eraser in the abrasion test is because rubbing with an eraser is similar to rubbing with a stylus pen, and by the eraser test, for example, the abrasion resistance with respect to relatively soft matter such as a stylus pen, a finger, cloth of clothing or a bag may be evaluated. Incidentally, although a steel wool test, for example, is known as an abrasion test, since steel wool is a thin metal wire, and is totally different form the relatively soft matter described above, the abrasion resistance with respect to the relatively soft matter such as those described above cannot be evaluated by the steel wool test.

A stacked body for a flexible display device, a stacked body for a display device, and a flexible display device in the present disclosure are hereinafter described in detail.

A. Stacked Body for a Flexible Display Device

The stacked body for a flexible display device in the present disclosure comprises a substrate layer, and an antistatic layer, wherein a surface resistance of an antistatic layer side surface of the stacked body for a flexible display device is $9\times10^{13}\Omega/\square$ or less; and a surface resistance of the antistatic layer side surface of the stacked body for a flexible display device after an eraser test is $9\times10^{13}\Omega/\square$ or less, wherein, in the eraser test, the antistatic layer side surface of the stacked body for a flexible display device is rubbed with a 6 mm diameter eraser, for 2500 strokes, applying a load of 9.8 N.

FIG. 1 is a schematic cross-sectional view illustrating an example of a stacked body for a flexible display device in the present disclosure. As shown in FIG. 1, stacked body for a flexible display device 1 comprises substrate layer 2, and antistatic layer 3. The surface resistance of the antistatic layer 3 side surface of the stacked body for a flexible display device 1 is a predetermined value or less. Also, the surface resistance of the antistatic layer 3 side surface of the stacked body for a flexible display device 1 after a predetermined eraser test is also a predetermined value or less.

As described above, the present disclosure was achieved based on the new finding that, in the stacked body for a flexible display device, the abrasion resistance and the surface resistance before and after the eraser test are correlated with each other. In the present disclosure, excellent abrasion resistance may be obtained by the surface resistance, of the antistatic layer side surface of the stacked body for a flexible display device, before and after an eraser test being a predetermined value or less.

The reason therefor is not clear, but presumed as follows. That is, when an eraser test is carried out to the surface of a stacked body for a flexible display device, the surface of the stacked body for a flexible display device is electrified by the friction of the eraser. The layer constituting the stacked body for a flexible display device may be deteriorated and an electrification damage may occur when the charged electricity is discharged. When such an electrification damage occurs, the surface condition of the stacked body for a flexible display device is believed to be changed so that the abrasion resistance is decreased in some cases. In contrast to this, in the present disclosure, since the surface resistance of the antistatic layer side surface of the stacked body for a flexible display device after the eraser test is a predetermined value or less, the electrification of the antistatic layer side surface of the stacked body for a flexible display device by the eraser test is believed to be suppressed, so that the deterioration of the layer or the electrification damage described above may be suppressed. As the result, excellent abrasion resistance is presumed to be obtained.

Also, in the present disclosure, since surface resistance of the antistatic layer side surface of the stacked body for a flexible display device after an eraser test is a predetermined value or less, for example, the abrasion resistance with respect to a relatively soft matter such as a stylus pen, a finger, cloth of clothing or a bag may be improved.

Also, in the present disclosure, since the abrasion resistance may be easily inferred from the initial surface resistance before an eraser test, a target abrasion resistance for the stacked body for a flexible display device may be easily designed.

Each constitution of the stacked body for a flexible display device in the present disclosure is hereinafter described.

1. Properties of Stacked Body for Flexible Display Device

In the present disclosure, the surface resistance of the antistatic layer side surface of the stacked body for a flexible display device is $9\times10^{13}\Omega/\square$ or less, preferably $9\times10^{12}\Omega/\square$ or less. By the initial surface resistance, of the antistatic layer side surface of the stacked body for a flexible display device, being in the range, the surface resistance of the antistatic layer side surface of the stacked body for a flexible display device after a predetermined eraser test tends to be in a predetermined range so that excellent abrasion resistance is presumed to be obtained. Also, by the initial surface resistance, of the antistatic layer side surface of the stacked body for a flexible display device, being in the range, excellent antistatic property may be obtained.

Also, in the present disclosure, the surface resistance of the antistatic layer side surface of the stacked body for a flexible display device, after an eraser test is $9\times10^{12}\Omega/\square$ or less, preferably $5\times10^{12}\Omega/\square$ or less, and more preferably $9\times10^{12}\Omega/\square$ or less; wherein, in the eraser test, the antistatic layer side surface of the stacked body for a flexible display device is rubbed with a 6 mm diameter eraser, for 2500 strokes, applying a load of 9.8 N. By the surface resistance of the antistatic layer side surface of the stacked body for a flexible display device, after a predetermined eraser test being in the range, excellent abrasion resistance may be obtained as well as excellent antistatic property may be maintained.

Also, the ratio of the surface resistance of the antistatic layer side surface of the stacked body for a flexible display device after the eraser test, with respect to an initial surface resistance, is preferably, for example, 20.0 or less, more preferably 10.0 or less, and further preferably 5.0 or less. By the ratio of the surface resistance being in the range, the abrasion resistance may be improved. The reason therefor is not clear, but presumed as follows. That is, the ratio of the surface resistance is high when, for example, the initial surface resistance is low and the surface resistance after the eraser test is high. Meanwhile, the ratio of the surface resistance is low when, for example, the initial surface resistance is low and the surface resistance after the eraser test is also low. In the latter case, it is believed that the surface of the stacked body for a flexible display device is not likely to be electrified by the friction of the eraser so that electrification damage is not likely to occur. Therefore, by the ratio of the surface resistance being low as in the range, it is believed that the electrification of the antistatic layer side surface of the stacked body for a flexible display device by the eraser test may further by suppressed so that the electrification damage may further be suppressed. As the result, the abrasion resistance is presumed to be improved. Also, since the surface resistance tend to be increased after the eraser test as compared to before the eraser test, the ratio of the surface resistance may be, for example, 1.0 or more.

The ratio of the surface resistance may be determined from the following formula wherein the initial surface resistance of the antistatic layer side surface of the stacked body for a flexible display device before the eraser test is regarded as “A”; and the surface resistance of the antistatic layer side surface of the stacked body for a flexible display device after the eraser test is regarded as “B”.

Ratio of surface resistance=$B/A$

Here, the eraser test may be carried out by the following procedure. That is, using a 6 mm diameter eraser, the eraser is inserted into a jig provided with a 6 mm diameter hole so that 4 mm of the tip of the eraser is exposed from the jig, the jig with the eraser is installed into a color fastness rubbing tester, and the antistatic layer side surface of the stacked body for a flexible display device is rubbed for 2500 strokes, with the eraser, applying a load of 9.8 N and at traveling speed of 80 mm/sec. As the 6 mm diameter eraser, for example, 6 mm diameter eraser from Minoan Co., Ltd. may be used. Also, as a color fastness rubbing tester, for example, Color Fastness Rubbing Tester AB-301 from Tester Sangyo Co., Ltd. may be used.

Also, the surface resistance may be measured by using Hiresta-UX MCP-HT type from Nittoseiki Analytech Co., Ltd. as a resistivity meter, using MCP-HTO14 URS probe as a probe after the eraser test, using MCP-HTP11 UA probe for the initial before the eraser test, and at applied voltage of 1000 V. Also, the surface resistance of the antistatic layer side surface of the stacked body for a flexible display device is measured at ten places, and the arithmetic average value of the measurement value of the ten places is regarded as the surface resistance. Incidentally, when measuring the surface resistance, the measurement is carried out after leaving the stacked body for a flexible display device to stand for 1 hour under environment of temperature of 23±2° C., and humidity of 50±10%.

Also, the antistatic layer side surface of the stacked body for a flexible display device means a surface on the side where the antistatic layer is placed, among the substrate layer and the antistatic layer, in the stacked body for a flexible display device including at least a substrate layer and an antistatic layer. In the stacked body for a flexible display device, there is not only a case where the antistatic layer is placed on the outermost surface, but also a case where the substrate layer, the antistatic layer, and the functional layer, for example, are stacked in this order as described later. When the substrate layer, the antistatic layer, and the functional layer, for example, are stacked in this order as described above, the surface of the side where the functional layer is placed is the surface where the antistatic layer is placed.

Also, in the present disclosure, the average value of the friction force with respect to the eraser, of the antistatic layer side surface of the stacked body for a flexible display device is preferably, for example, 0.98 N or more and 9.80 N or less, more preferably 1.96 N or more and 8.80 N or less, further preferably 2.45 N or more and 7.80 N or less. When the average value of the initial friction force with respect to the eraser is in the range, the abrasion resistance may be increased.

Also, in the present disclosure, the maximum value of the friction force with respect to the eraser, of the antistatic layer side surface of the stacked body for a flexible display device, after an eraser test is preferably, for example, 0.98 N or more and 9.80 N or less, more preferably 1.96 N or more and 8.80 or less, and further preferably 2.45 N or more and 7.80 N or less, wherein, in the eraser test, the antistatic layer side surface of the stacked body for a flexible display device is rubbed with a 6 mm diameter eraser, for 2500 strokes, applying a load of 9.8 N. By the maximum value of the friction force with respect to the eraser, of the antistatic layer side surface of the stacked body for a flexible display device, after a predetermined eraser test being in the range, excellent abrasion resistance may be obtained as well as excellent antistatic property may be maintained.

Also, the ratio of the maximum value of the friction force with respect to the eraser after the eraser test, with respect to the average value of the initial friction force with respect to the eraser, of the antistatic layer side surface of the stacked body for a flexible display device is preferably, for example, 1.50 or less, more preferably 1.48 or less, and further preferably 1.45 or less. By the ratio of the friction force with respect to the eraser being in the range, the abrasion resistance may be improved. Also, the ratio of the friction force with respect to the eraser may be, for example, 1.00 or more.

The ratio of the friction force with respect to the eraser may be determined from the following formula wherein the average value of initial friction force with respect to the eraser, of the antistatic layer side surface of the stacked body for a flexible display device before the eraser test is regarded as “C”; and the maximum value of the friction force with respect to the eraser, of the antistatic layer side surface of the stacked body for a flexible display device, after the eraser test is regarded as “D”.

Ratio of friction force with respect to eraser=$D/C$

Figure 2:
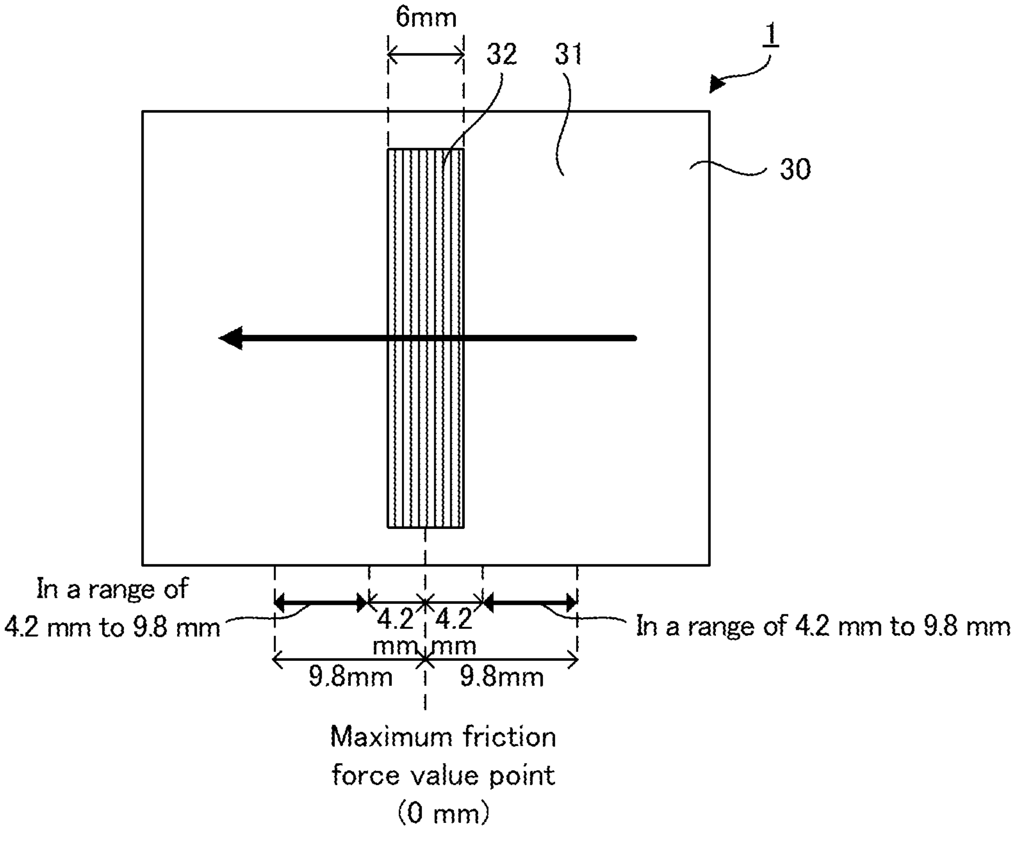
FIG. 2 is a schematic view explaining a method for measuring a friction force with respect to an eraser.

Here, the friction force with respect to the eraser may be measured by using a 6 mm diameter eraser, inserting the eraser into a jig provided with a 6 mm diameter hole so that 4 mm of the tip of the eraser is exposed from the jig, installing the jig with the eraser into a friction measurement device, and rubbing the antistatic layer side surface of the stacked body for a flexible display device with the eraser, applying a load of 1.96 N and at traveling speed of 840 mm/min. As the 6 mm diameter eraser, for example, 6 mm diameter eraser from Minoan Co., Ltd. may be used. Also, as a friction measurement device, for example, TriboGear Type 18 from Shinto Scientific Co., Ltd. may be used. Specifically, as shown in FIG. 2, the eraser test described above is firstly carried out to a part of antistatic layer side surface 30 of the stacked body for a flexible display device 1, and eraser tested portion 32 having a rectangular shape is formed. Then, using the eraser, the antistatic layer side surface 30 of the stacked body for a flexible display device 1 is rubbed, as shown with an arrow, in the order of eraser test-untested portion 31, eraser tested portion 32, and eraser test-untested portion 31 to measure the friction force. In doing so, as shown with an arrow, the eraser is moved vertically to the longitudinal direction of the rectangle eraser tested portion 32. The average value of the friction force with respect to the eraser of the eraser test-untested portion may be regarded as the average value of the initial friction force with respect to the eraser, and the maximum value of the friction force with respect to the eraser of the eraser tested portion may be regarded as the maximum value of the friction force with respect to the eraser after the eraser test. Also, as shown in FIG. 2, when the point at which the friction force with respect to the eraser is the maximum in the eraser tested portion 32 is regarded as 0 mm, the average value of the initial friction force with respect to the eraser test is regarded as the average value of the friction force in the eraser test-untested portion 31, in a range of 4.2 mm to 9.8 mm on the basis of the point (0 mm) described above.

Also, in the present disclosure, the contact angle with respect to water, of the antistatic layer side surface of the stacked body for a flexible display device, is preferably, for example, 100° or more. When the contact angle with respect to water is in the range, sufficient antifouling property may be obtained, thereby, adhesion of fingerprint or dirt may be suppressed, and even when the fingerprint or dirt is adhered, it may be easily wiped off. Also, the contact angle with respect to water is preferably, for example, 150° or less.

Here, the contact angle with respect to water may be measured by a sessile drop method according to JIS R3257: 1999. Specifically, 2 ml of water is dropped on the antistatic layer side surface of the stacked body for a flexible display device, and the contact angle immediately after the drop is measured. The contact angle with respect to water of the antistatic layer side surface of the stacked body for a flexible display device is measured at ten places, and the arithmetic average value of the measurement value of the ten places is regarded as the contact angle with respect to water. As the measurement device, for example, a contact angle meter DropMaster 300 from Kyowa Interface Science Co., Ltd. may be used. Incidentally, the contact angle with respect to water, of an antistatic layer side surface of the stacked body for a flexible display device refers to the initial contact angle with respect to water before the eraser test, of an antistatic layer side surface of the stacked body for a flexible display device.

The total light transmittance of the stacked body for a flexible display device in the present disclosure is preferably, for example, 85% or more, more preferably 88% or more, and further preferably 90% or more. By having such a high total light transmittance, a stacked body for a flexible display device having excellent transparency may be obtained.

Here, the total light transmittance of the stacked body for a flexible display device may be measured according to JIS K-7361-1: 1997, and may be measure with, for example, with a haze meter HM150 from Murakami Color Research Laboratory Co., Ltd.

The haze of the stacked body for a flexible display device in the present disclosure is preferably, for example 5% or less, more preferably 2% or less, and further preferably 1% or less. By having such a low haze, a stacked body for a flexible display device having excellent transparency may be obtained.

Here, the haze of the stacked body for a flexible display device may be measured according to JIS K-7136: 2000, and may be measure with, for example, with a haze meter HM150 from Murakami Color Research Laboratory Co., Ltd.

The stacked body for a flexible display device in the present disclosure preferably has a bending resistance.

Specifically, when the dynamic bending test described below is carried out to the stacked body for a flexible display device repeatedly for 200,000 times, it is preferable that a crack or a fracture does not occur in the stacked body for a flexible display device, and it is more preferable that a crack or a fracture does not occur in the stacked body for a flexible display device when the dynamic bending test is carried out repeatedly for 500,000 times.

In the dynamic bending test, the stacked body for a flexible display device may be folded so that the antistatic layer faces outward, or the stacked body for a flexible display device may be folded so that the antistatic layer faces inward; and in either of these cases, it is preferable that a crack or a fracture does not occur in the stacked body for a flexible display device.

(Dynamic Bending Test)

Figure 3A:
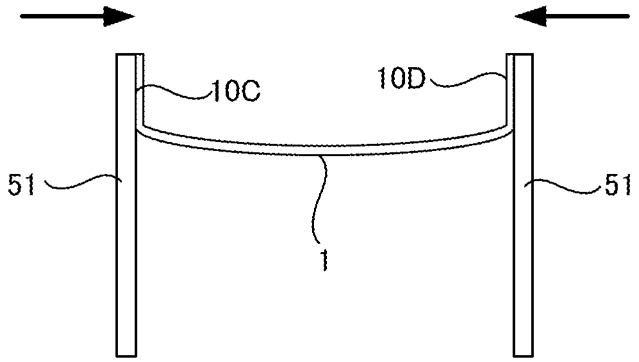
FIGS. 3A to 3C are schematic views explaining a dynamic bending test.
Figure 3B:
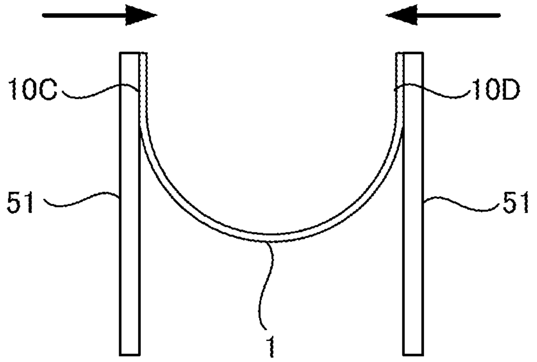
Figure 3C:
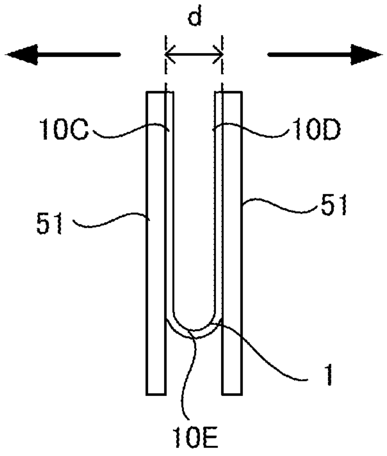

The dynamic bending test is carried out as follows. Firstly, a stacked body for a flexible display device having a size of 20 mm×100 mm is prepared. Then, in the dynamic bending test, as shown in FIG. 3A, short side portion 10C and short side portion 10D opposing to the short side portion 10C of the stacked body for a flexible display device 1 are respectively fixed by parallelly arranged fixing portions 51. Also, as shown in FIG. 3A, the fixing portions 51 are movable by sliding in horizontal direction. Then, as shown in FIG. 3B, by moving the fixing portions 51 so as to be closer to each other, the stacked body for a flexible display device 1 is deformed so as to be folded. Further, as shown in FIG. 3C, after moving the fixing portions 51 to the position wherein distance "d" between the two opposing short side portions 10C and 10D of the stacked body for a flexible display device 1 fixed by the fixing portions 51 is 30 mm, the deformation of the stacked body for a flexible display device 1 is dissolved by moving the fixing portions 51 in opposite directions. As shown in FIGS. 3A to 3C, by moving the fixing portions 51, the stacked body for a flexible display device 1 may be folded into 180°. Also, by carrying out the dynamic bending test so that bent portion 10E of the stacked body for a flexible display device 1 does not protrude from the lower end edge of the fixing portions 51, and by controlling the distance when the fixing portions 51 are the closest, distance "d" between the two opposing short side portions 10C and 10D of the stacked body for a flexible display device 1 may be 30 mm. In this case, the outer diameter of the bent portion 10E is regarded as 30 mm.

In the stacked body for a flexible display device, it is preferable that a crack or a fracture does not occur when the dynamic bending test wherein the stacked body for a flexible display device 1 is folded into 180° so that the distance "d" between the opposing short side portions 10C and 10D of the stacked body for a flexible display device 1 is 30 mm, is carried out repeatedly for 200,000 times; among the above, it is preferable that a crack or a fracture does not occur when the dynamic bending test wherein the stacked body for a flexible display device 1 is folded into 180° so that the distance "d" between the opposing short side portions 10C and 10D of the stacked body for a flexible display device is 20 mm, is carried out repeatedly for 200,000 times; particularly, it is preferable that a crack or a fracture does not occur when the dynamic bending test wherein the stacked body for a flexible display device 1 is folded into 180° so that the distance "d" between the opposing short side portions 10C and 10D of the stacked body for a flexible display device 1 is 10 mm, is carried out repeatedly for 200,000 times.

2. Antistatic Layer

The antistatic layer in the present disclosure is placed on one surface side of the substrate layer, and is a layer configured to impart an antistatic property to the stacked body for a flexible display device.

The antistatic layer is not particularly limited as long as it has an antistatic property, and may include at least an antistatic agent. Also, the antistatic layer may include, for example, an antistatic agent and a resin.

As the antistatic agent, for example, either one of a low molecular weight type antistatic agent, and a polymer type antistatic agent may be used. Also, examples of the antistatic agent may include an ion conductive type antistatic agent, and an electron conductive type antistatic agent. One kind of the antistatic agent may be used alone, and two kind or more may be used in combination.

Examples of the ion conductive type antistatic agent may include cationic antistatic agents such as quaternary ammonium salts, and pyridium salts; anionic antistatic agents such as alkali metal salts of, for example, sulfonic acids, phosphoric acids, and carboxylic acids such as lithium salts, sodium salts, and potassium salts; amphoteric antistatic agents such as amino acid based, and amino acid sulfate ester based; nonionic antistatic agents such as amino alcohol based, glycerin based, and polyethylene glycol based; and ionic liquids. Among these, a quaternary ammonium salt or a lithium salt is preferable since it exhibits excellent compatibility with a resin.

Examples of the electron conductive type antistatic agent may include conductive polymers such as polyacetylene based, and polythiophene based; conductive particles such as metal particles, metal oxide particles, and carbon nanotubes; and conductive fibers. Also, an antistatic agent obtained by combining a dopant with a conductive polymer such as polyacetylene and polythiophene; or an antistatic agent wherein conductive particles are included in the conductive polymer, may be used. Among them, a conductive polymer is preferable from the viewpoint of maintaining the antistatic property.

Specific examples of the conductive polymer may include conductive polymers such as polyacetylene, polyaniline, polythiophene, polypyrrole, polyphenylene sulfide, poly(1,6-heptadiyne), polybiphenylene (polyparaphenylene), polyparaphenylene sulfide, polyphenylacetylene, poly(2,5-thienylene), and derivatives thereof. Preferable examples thereof may include polythiophene based conductive polymers such as 3,4-ethylenedioxythiophene (PEDOT). By using the conductive polymer as the antistatic agent, the antistatic property may be maintained for a long period of time.

Examples of the metal constituting the fine metal particles may include Au, Ag, Cu, Al, Fe, Ni, Pd, and Pt themselves, or an alloy of these metals.

The metal oxide constituting the metal oxide particles is not particularly limited, and examples thereof may include tin oxide, antimony oxide, antimony doped tin oxide (ATO), tin doped indium oxide (ITO), aluminum doped zinc oxide (AZO), fluorine doped tin oxide (FTO), and zinc oxide (ZnO). Among them, antimony doped tin oxide (ATO) is preferable from the viewpoint of exhibiting excellent antistatic property. Also, among ATO, a chain-like ATO wherein a plurality of ATO particles are connected, is preferable.

Among the antistatic agents described above, an antistatic agent that is not particulate is preferable. This is because the antistatic agent other than the particulate antistatic agent tends to maintain the antistatic property as compared with the particulate antistatic agent. In particular, the antistatic agent is preferably a polymer type antistatic agent. This is because the polymer type antistatic agent may impart antistatic property even in a small amount, and is able to maintain optical properties and hardness.

The content of the antistatic agent is not particularly limited as long as it is an amount capable of obtaining the antistatic layer satisfying the surface resistance described above, and is appropriately selected according to, for example, the material of the antistatic layer.

For example, when the antistatic layer includes an antistatic agent and a resin, the contents of the antistatic agent may be 0.1 parts by mass or more and 100 parts by mass or less, may be 0.2 parts by mass or more and 50 parts by mass or less, and may be 0.3 parts by mass or more and 20 parts by mass or less, with respect to 100 parts by mass of the resin component. When the content of the antistatic agent is too low, there may be cases where sufficient antistatic property may not be imparted to the antistatic layer; or an antistatic layer satisfying the surface resistance described above may not be obtained. Also, when the content of the antistatic agent is too high, it may be difficult to form the antistatic layer, or the abrasion resistance may be lowered.

The resin may be appropriately selected according to the performance to be imparted to the antistatic layer.

For example, when the antistatic layer is not required to have a hard coating property, specific examples of the resin may include at least one kind selected from the group consisting of (meth)acrylic based resins, cellulose based resins, urethane based resins, vinyl chloride based resins, polyester based resins, polyolefin based resins, polycarbonates, nylons, polystyrenes, and ABS resins. Among them, for example, (meth)acrylic based resins, and polyester based resins are preferable from the viewpoint of ease of processing and hardness.

Examples of the (meth)acrylic based resin may include polymethyl methacrylate. Also, examples of the cellulose based resin may include diacetyl cellulose, cellulose acetate propionate (CAP), and cellulose acetate butyrate (CAB). Examples of the urethane based resin may include urethane resins.

Examples of the vinyl chloride based resin may include polyvinyl chloride, and a vinyl chloride-vinyl acetate copolymer. Also, examples of the polyester based resin may include polyethylene terephthalate. Also, examples of the polyolefin based resin may include polyethylene, and polypropylene.

Also, for example, when the antistatic layer has a hard coating property, specific examples of the resin may include a cured product of a polymerizable compound. Incidentally, since the polymerizable compound may be similar to the polymerizable compound used for the hard coating layer described later, the explanation is omitted herein.

The antistatic layer may include an antifoulant. The stacked body for a flexible display device may be imparted with an antifouling property.

The antifoulant is not particularly limited, and examples thereof may include a silicone based antifoulant, a fluorine based antifoulant, and a silicone based-fluorine based antifoulant. Also, the antifoulant may be an acrylic based antifoulant. One kind of the antifoulant may be used alone, and two kinds or more may be used as a mixture.

A fingerprint is not likely to be marked (inconspicuous) on the antistatic layer including a silicone based antifoulant or a fluorine based antifoulant, and is easily wiped off. Also, When the silicone based antifoulant or the fluorine based antifoulant is included, since the surface tension when applying a composition for an antistatic layer may be decreased, the leveling property is excellent, so that the appearance of the obtained antistatic layer will be excellent.

Also, the antistatic layer including the silicone based antifoulant is excellent in the sliding property, and excellent in scratch resistance. In a display device provided with a stacked body for a flexible display device including an antistatic layer including such a silicone based antifoulant, since the sliding property when it is touched with a finger or a stylus pen is excellent, the texture is improved.

In order to improve the durability of the antifouling performance, the antifoulant preferably includes a reactive functional group. If the antifoulant does not include the reactive functional group, regardless of whether the form of the stacked body for a flexible display device is a rolled shape or a sheet shape, the antifoulant may be transferred to the surface opposite to the antistatic layer side surface of the stacked body for a flexible display device, when the stacked body for a flexible display device is stacked. Thus, when another layer is adhered or applied to the surface opposite to the antistatic layer side surface of the stacked body for a flexible display device, there is a concern that the other layer is peeled off, and further, there is a concern that the other layer is easily peeled off when it is bent repeatedly. In contrast to this, when the antifoulant includes the reactive functional group, performance durability of the antifouling performance is improved.

The number of the reactive functional groups included in the antifoulant may be 1 or more, and preferably 2 or more. By using the antifoulant including 2 or more reactive functional groups, excellent scratch resistance may be imparted to the antistatic layer.

The content of the antifoulant is preferably, for example, 0.01 parts by mass or more and 3.0 parts by mass or less, with respect to 100 parts by mass of the resin component. When the content of the antifoulant is too low, there may be cases where sufficient antifouling property may not be imparted to the antistatic layer. Also, when the content of the antifoulant is too high, the abrasion resistance may be decreased.

The antistatic layer may include an additive such as an inorganic particle, an organic particle, an ultraviolet absorber, an antioxidant, a light stabilizer, an antiglare agent, a leveling agent, a surfactant, an easy lubricant, various sensitizers, a flame retardant, an adhesive imparting agent, a polymerization inhibitor, and a surface modifier, if necessary.

The thickness of the antistatic layer is not particularly limited as long as it is a thickness capable of obtaining an antistatic layer satisfying the surface resistance described above, and is preferably, for example, 0.5 μm or more and 50 μm or less, more preferably 1.0 μm or more and 40 μm or less, and further preferably 1.5 μm or more and 30 μm or less. When the thickness of the antistatic layer is too thin, sufficient antistatic property may not be obtained. Also, when the thickness of the antistatic layer is too thick, the flexibility may be deteriorated.

Here, the thickness of the antistatic layer may be the average value of the thickness of arbitrary 10 points obtained by measuring from the thickness directional cross-section of the stacked body for a flexible display device by observing with a transmission electron microscope (TEM), a scanning electron microscope (SEM) or a scanning transmission electron microscope (STEM). Incidentally, the same may be applied to the measuring methods of the thickness of other layers included in the stacked body for a flexible display device.

The antistatic layer may be placed on one surface side of the substrate layer; among the above, the antistatic layer is preferably placed on the outermost surface in the stacked body for a flexible display device. This is because the surface resistance of the antistatic layer side surface of the stacked body for a flexible display device may be easily adjusted to satisfy the surface resistance described above.

Examples of a method for forming an antistatic layer may include a method wherein the substrate layer is coated with a composition for an antistatic layer, and cured.

3. Substrate Layer

The substrate layer in the present disclosure is a member configured to support the antistatic layer described above, and has transparency.

The substrate layer is not particularly limited as long as it has transparency; and examples thereof may include a resin substrate, and a glass substrate.

(1) Resin Substrate

The resin constituting the resin substrate is not particularly limited as long as it is able to obtain a resin substrate having transparency; and examples thereof may include a polyimide based resin, a polyamide based resin, and a polyester based resin. Examples of the polyimide based resin may include polyimide, polyamideimide, polyetherimide, and polyesterimide. Examples of the polyester based resin may include polyethylene terephthalate, polypropylene terephthalate, polybutylene terephthalate, and polyethylene naphthalate. Among them, the polyimide based resin, the polyamide based resin, or a mixture thereof is preferable since it has bending resistance and has excellent hardness and transparency, and the polyimide based resin is more preferable.

The polyimide based resin is not particularly limited as long as it is able to obtain a resin substrate having transparency; and among the above, polyimide and polyamideimide are preferably used.

(a) Polyimide

The polyimide is obtained by reacting a tetracarboxylic acid component and a diamine component. The polyimide is not particularly limited as long as it satisfies the average value of the tensile storage elastic modulus described above and has transparency; and it is preferable to have at least one kind of the structure selected from the group consisting of the structure represented by the following general formula (1) and the following general formula (3), for example, from the viewpoint of having excellent transparency and excellent stiffness.

[Chemical 1]

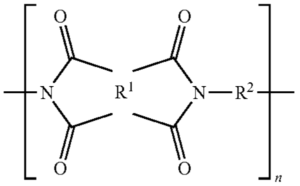

(1)

In the general formula (1), $R^1$ represents a tetravalent group which is a tetracarboxylic acid residue; and $R^2$ represents at least one kind of divalent group selected from the group consisting of a trans-cyclohexanediamine residue, a trans-1,4-bismethylenecyclohexanediamine residue, a 4,4'-diaminodiphenylsulfone residue, a 3,4'-diaminodiphenylsulfone residue, and a divalent group represented by the following general formula (2). The “n” represents the number of repeating units, and is 1 or more.

[Chemical 2]

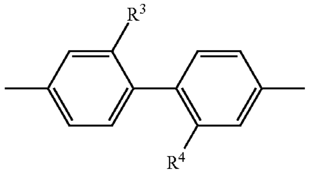

(2)

In the general formula (2), $R^3$ and $R^4$ each independently represents a hydrogen atom, an alkyl group, or a perfluoroalkyl group.

[Chemical 3]

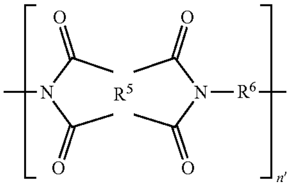

(3)

In the general formula (3), $R^5$ represents at least one kind of tetravalent group selected from the group consisting of a cyclohexane tetracarboxylic acid residue, a cyclopentanetetracarboxylic acid residue, a dicyclohexane-3,4,3',4'-tetracarboxylic acid residue, and a 4,4'-(hexafluoroisopropylidene)diphthalic acid residue; and $R^6$ represents a divalent group which is a diamine residue. The "n'" represents the number of repeating units, and is 1 or more.

Incidentally, "tetracarboxylic acid residue" refers to a residue obtained by excluding four carboxyl groups from a tetracarboxylic acid; and represents the same structure as a residue obtained by excluding an acid dianhydride structure from a tetracarboxylic acid dianhydride. Also, "diamine residue" refers to a residue obtained by excluding two amino groups from a diamine.

In the general formula (1), $R^1$ is a tetracarboxylic acid residue, and may be a residue obtained by excluding an acid dianhydride structure from a tetracarboxylic acid dianhydride. Examples of the tetracarboxylic acid dianhydride may include those described in WO 2018/070523. Among them, $R^1$ in the general formula (1) preferably includes at least one kind selected from the group consisting of a 4,4'-(hexafluoroisopropylidene)diphthalic acid residue, a 3,3',4,4'-biphenyltetracarboxylic acid residue, pyromellitic acid residue, a 2,3',3,4'-biphenyltetracarboxylic acid residue, a 3,3',4,4'-benzophenone tetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentane tetracarboxylic acid residue from the viewpoint of improved transparency and improved stiffness. It is further preferable to include at least one kind selected from the group consisting of a 4,4'-(hexafluoroisopropylidene)diphthalic acid residue, a 4,4'-oxydiphthalic acid residue and a 3,3',4,4'-diphenylsulfone tetracarboxylic acid residue.

In $R^1$, these preferable residues are preferably included in total of 50 mol % or more, more preferably 70 mol % or more, and further preferably 90 mol % or more.

Also, as $R_1$, it is also preferable to use a mixture of the followings: a tetracarboxylic acid residue group (Group A) suitable for improving rigidity such as at least one kind selected from the group consisting of a 3,3',4,4'-biphenyltetracarboxylic acid residue, a 3,3',4,4'-benzophenone tetracarboxylic acid residue, and a pyromellitic acid residue; and a tetracarboxylic acid residue group (Group B) suitable for improving transparency such as at least one kind selected from the group consisting of a 4,4'-(hexafluoroisopropylidene)diphthalic acid residue, a 2,3',3,4'-biphenyltetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentanetetracarboxylic acid residue.

In this case, in relation to the content ratio of the tetracarboxylic acid residue group suitable for improving the rigidity (Group A) and the tetracarboxylic acid residue group suitable for improving transparency (Group B), with respect to 1 mol of the tetracarboxylic acid residue group suitable for improving transparency (Group B), the tetracarboxylic acid residue group suitable for improving rigidity (Group A) is preferably 0.05 mol or more and 9 mol or less, more preferably 0.1 mol or more and 5 mol or less, and further preferably 0.3 mol or more and 4 mol or less.

Among them, $R^2$ in the general formula (1) is preferably at least one kind of divalent group selected from the group consisting of a 4,4'-diaminodiphenylsulfone residue, a 3,4'-diaminodiphenylsulfone residue, and a divalent group represented by the general formula (2); and is further preferably at least one kind of divalent group selected from the group consisting of a 4,4'-diaminodiphenylsulfone residue, a 3,4'-diaminodiphenylsulfone residue, and a divalent group represented by the general formula (2) wherein $R^3$ and $R^4$ are a perfluoroalkyl group, from the viewpoint of improved transparency and improved stiffness.

Among them, from the viewpoint of improved transparency and improved stiffness, $R^5$ in the general formula (3) preferably includes a 4,4'-(hexafluoroisopropylidene) diphthalic acid residue, a 3,3',4,4'-diphenylsulfontetracarboxylic acid residue, and oxydiphthalic acid residue.

The $R^5$ preferably includes 50 mol % or more, more preferably 70 mol % or more, and further preferably 90 mol % or more of these preferable residues.

The $R^6$ in the general formula (3) is a diamine residue, and may be a residue obtained by excluding two amino groups from a diamine. Examples of the diamine may include those described in, for example, WO 2018/070523. Among them, from the viewpoint of improved transparency and improved stiffness, $R^6$ in the general formula (3) preferably includes at least one kind of divalent group selected from the group consisting of a 2,2'-bis(trifluoromethyl)benzidine residue, a bis[4-(4-aminophenoxy)phenyl]sulfone residue, a 4,4'-diaminodiphenylsulfone residue, a 2,2-bis[4-(4-aminophenoxy)phenyl]hexafluoropropane residue, a bis[4-(3-aminophenoxy)phenyl]sulfone residue, a 4,4'-diamino-2,2'-bis(trifluoromethyl)diphenylether residue, a 1,4-bis[4-amino-2-(trifluoromethyl)phenoxy]benzene residue, a 2,2-bis [4-(4-amino-2-trifluoromethylphenoxy) phenyl] hexafluoropropane residue, a 4,4'-diamino-2-(trifluoromethyl)diphenyl ether residue, a 4,4'-diaminobenzanilide residue, a N,N'-bis(4-aminophenyl) terephthalamide residue and a 9,9-bis(4-aminophenyl) fluorene residue; and further preferably includes at least one kind of divalent group selected from the group consisting of a 2,2'-bis(trifluoromethyl)benzidine residue, a bis[4-(4-aminophenoxy)phenyl]sulfone residue, and a 4,4'-diaminodiphenylsulfone residue.

In $R^6$, these preferable residues are preferably included in total of 50 mol % or more, more preferably 70 mol % or more, and further preferably 90 mol % or more.

Also, as $R^6$, it is also preferable to use a mixture of the followings: a diamine residue group (Group C) suitable for improving rigidity such as at least one kind selected from the group consisting of a bis[4-(4-aminophenoxy)phenyl] sulfone residue, a 4,4'-diaminobenzanilide residue, a N,N'-bis(4-aminophenyl) terephthalamide residue, a paraphenylenediamine residue, a metaphenylenediamine residue, and a 4,4'-diaminodiphenylmethane residue; and a diamine residue group (Group D) suitable for improving transparency such as at least one kind selected from the group consisting of a 2,2'-bis(trifluoromethyl)benzidine residue, a 4,4'-diaminodiphenyl sulfone residue, a 2,2-bis[4-(4-aminophenoxy)phenyl] hexafluoropropane residue, a bis[4-(3-aminophenoxy)phenyl]sulfone residue, a 4,4'-diamino-2,2'-bis(trifluoromethyl)diphenylether residue, a 1,4-bis[4-amino-2-(tirfluoromethyle)phenoxy] benzene residue, a 2,2-bis[4-(4-amino-2-trifluoromethylphenoxy)phenyl] hexafluoropropane residue, a 4,4'-diamino-2(trifluoromethyl)dipenylether residue, and a 9,9-bis(4-aminophenyl) fluorene residue.

In this case, in relation to the content ratio of the diamine residue group suitable for improving rigidity (Group C) and the diamine residue group suitable for improving transparency (Group D), with respect to 1 mol of the diamine residue group suitable for improving transparency (Group D), the diamine residue group suitable for improving rigidity (Group C) is preferably 0.05 mol or more and 9 mol or less, more preferably 0.1 mol or more and 5 mol or less, and further preferably 0.3 mol or more and 4 mol or less.

In the structure represented by the general formula (1) and the general formula (3), "n" and "n'" each independently represents the number of repeating units, and is 1 or more. The number of repeating units "n" in the polyimide may be appropriately selected according to the structure, and is not particularly limited. The average number of repeating units may be, for example, 10 or more and 2000 or less, and is preferably 15 or more and 1000 or less.

Also, the polyimide may include a polyamide structure in a part thereof. Examples of the polyamide structure that may be included may include a polyamideimide structure including a tricarboxylic acid residue such as trimellitic acid anhydride; and a polyamide structure including a dicarboxylic acid residue such as terephthalic acid.

From the viewpoint of improved transparency and improved surface hardness, at least one of the tetravalent group which is a tetracarboxylic acid residue of $R^1$ or $R^5$, and the divalent group which is a diamine residue of $R^2$ or $R^6$ preferably includes an aromatic ring; and preferably inlcudes at least one selected from the group consisting of (i) a fluorine atom, (ii) an aliphatic ring, and (iii) a structure wherein aromatic rings are connected to each other by an alkylene group which may be substituted with a sulfonyl group or a fluorine. When the polyimide includes at least one kind selected from a tetracarboxylic acid residue including an aromatic ring, and a diamine residue including an aromatic ring, the molecular skeleton becomes rigid, the orientation property is increased, and the surface hardness is improved; however, the absorption wavelength of the rigid aromatic ring skeleton tends to be shifted to the longer wavelength side, and the transmittance of the visible light region tends to be decreased. Meanwhile, when the polyimide includes (i) a fluorine atom, the transparency is improved since it may make the electronic state in the polyimide skeleton to a state wherein a charge transfer is difficult.

Also, when the polyimide includes (ii) an aliphatic ring, transparency is improved since the transfer of charge in the skeleton may be inhibited by breaking the conjugation of n electrons in the polyimide skeleton. Also, when the polyimide includes (iii) a structure wherein aromatic rings are connected to each other by an alkylene group which may be substituted with a sulfonyl group or a fluorine, transparency is improved since the transfer of charge in the skeleton may be inhibited by breaking the conjugation of n electrons in the polyimide skeleton.

Among them, from the viewpoint of improved transparency and improved surface hardness, at least one of the tetravalent group which is a tetracarboxylic acid residue of $R^1$ or $R^5$, and the divalent group which is a diamine residue of $R^2$ or $R^6$ preferably includes an aromatic ring and a fluorine atom; and the divalent group which is a diamine residue of $R^2$ or $R^6$ preferably includes an aromatic ring and a fluorine atom.

Specific examples of such polyimide may include those having a specific structure described in WO 2018/070523.

The polyimide may be synthesized by a known method. Also, a commercially available polyimide may be used. Examples of the commercially available products of polyimide may include Neopulim (registered trademark) from Mitsubishi Gas Chemical Company, Inc.

The weight average molecular weight of the polyimide is preferably, for example, 3000 or more and 500,000 or less, more preferably 5000 or more and 300,000 or less, and further preferably 10,000 or more and 200,000 or less. When the weight average molecular weight is too low, sufficient strength may not be obtained, and when the weight average molecular weight is too high, the viscosity is increased and the solubility is decreased, so that a substrate layer having a smooth surface and uniform thickness may not be obtained in some cases.

Incidentally, the weight average molecular weight of the polyimide may be measured by gel permeation chromatography (GPC). Specifically, the polyimide is used as a N-methylpyrrolidone (NMP) solution having a concentration of 0.1% by mass; a 30 mmol % LiBr-NMP solution with a water content of 500 ppm or less is used as a developing solvent; and measurement is carried out using a GPC device (HLC-8120, used column: GPC LF-804 from SHODEX) from Tosoh Corporation, under conditions of a sample injecting amount of 50 μL, a solvent flow rate of 0.4 mL/min, and at 37° C. The weight average molecular weight is determined on the basis of a polystyrene standard sample having the same concentration as that of the sample.

(b) Polyamideimide

The polyamideimide is not particularly limited as long as it is able to obtain a resin substrate having transparency; and examples thereof may include those having a first block including a constituent unit derived from dianhydride, and a constituent unit derived from diamine; and a second block including a constituent unit derived from aromatic dicarbonyl compound, and a constituent unit derived from aromatic diamine. In the polyamideimide described above, the dianhydride may include, for example, biphenyltetracarboxylic acid dianhydride (BPDA) and 2-bis(3,4-dicarboxyphenyl) hexafluoropropanedianhydride (6FDA). Also, the diamine may include bistrifluoromethylbenzidine (TFDB). That is, the polyamideimide has a structure wherein a polyamideimide precursor including a first block wherein monomers including dianhydride and diamine are copolymerized; and a second block wherein monomers including an aromatic dicarbonyl compound and an aromatic diamine are copolymerized, is imidized. By including the first block including an imide bond and the second block including an amide bond, the polyamideimide is excellent in not only optical properties but also thermal and mechanical properties. In particular, by using bistrifluoromethylbenzidine (TFDB) as the diamine forming the first block, thermal stability and optical properties may be improved. Also, by using 2-bis(3,4-dicarboxyphenyl) hexafluoropropane dianhydride (6FDA) and biphenyltetracarboxylic acid dianhydride (BPDA) as the dianhydride forming the first block, birefringence may be improved, and heat resistance may be secured.

The dianhydride forming the first block comprises two kinds of dianhydrides, that is, 6FDA and BPDA. In the first block, a polymer to which TFDB and 6FDA are bonded, and a polymer to which TFDB and BPDA are bonded may be included, based on separate repeating units, respectively segmented; may be regularly arranged within the same repeating unit; and may be included in a completely random arrangement.

Among the monomers forming the first block, BPDA and 6FDA are preferably included as dianhydrides in a molar ratio of 1:3 to 3:1. This is because it is possible not only to secure the optical properties, but also to suppress deterioration of mechanical properties and heat resistance, and it is possible to have excellent birefringence.

The molar ratio of the first block and the second block is preferably 5:1 to 1:1. When the content of the second block is remarkably low, the effect of improving the thermal stability and mechanical properties due to the second block may not be sufficiently obtained in some cases. Also, when the content of the second block is higher than the content of the first block, although the thermal stability and mechanical properties may be improved, optical properties such as yellowness and transmittance, may be deteriorated, and the birefringence property may also be increased in some cases. Incidentally, the first block and the second block may be random copolymers, and may be block copolymers. The repeating unit of the block is not particularly limited.

Examples of the aromatic dicarbonyl compound forming the second block may include one kind or more selected from the group consisting of terephthaloyl chloride (p-terephthaloyl chloride, TPC), terephthalic acid, iso-phthaloyl dichloride, and 4,4'-benzoyl dichloride (4,4'-benzoyl chloride). One kind or more selected from terephthaloyl chloride (p-terephthaloyl chloride, TPC) and iso-phthaloyl dichloride may be preferably used.

Examples of the diamine forming the second block may include diamines including one kind or more flexible group selected from the group consisting of 2,2-bis(4-(4-aminophenoxy)phenyl)hexafluoropropane (HFBAPP), bis(4-(4-aminophenoxy)phenyl)sulfone (BAPS), bis(4-(3-aminophenoxy)phenyl)sulfone (BAPSM), 4,4'-diaminodiphenyl sulfone (ODDS), 3,3'-diaminodiphenyl sulfone (3DDS), 2,2-bis(4-(4-aminophenoxy)phenylpropane (BAPP), 4,4'-diaminodiphenylpropane (6HDA), 1,3-bis(4-aminophenoxy) benzene (134APB), 1,3-bis(3-aminophenoxy)benzene (133APB), 1,4-bis(4-aminophenoxy)biphenyl (BAPB), 4,4'-bis(4-amino-2-trifluoromethylphenoxy)biphenyl (6FAPBP), 3,3-diamino-4,4-dihydroxydiphenylsulfone (DABS), 2,2-bis(3-amino-4-hydroxyloxyphenyl)propane (BAP), 4,4'-diaminodiphenylmethane (DDM), 4,4'-oxydianiline (4-ODA) and 3,3'-oxydianiline (3-CDA).

When the aromatic dicarbonyl compound is used, it is easy to realize high thermal stability and mechanical properties, but may exhibit high birefringence due to the benzene ring in the molecular structure. Therefore, in order to suppress the decrease in birefringence due to the second block, it is preferable to use a diamine wherein a flexible group is introduced into the molecular structure. Specifically, the diamine is more preferably one kind or more diamine selected from bis(4-(3-aminophenoxy)phenyl)sulfone (BAPSM), 4,4'-diaminodiphenylsulfone (ODDS) and 2,2-bis(4-(4-aminophenoxy) phenyl) hexafluoropropane (HF-BAPP). In particular, the longer the length of the flexible group such as BAPSM, and a diamine including a substituent at meta position, the better the birefringence may be exhibited.

For the polyamideimide precursor including a first block wherein a dianhydride including a biphenyltetracarboxylic acid dianhydride (BPDA) and a 2-bis(3,4-dicarboxyphenyl) hexafluoropropanedianhydride (6FDA), and a diamine including bistrifluoromethylbenzidine (TFDB) are copolymerized; and a second block wherein an aromatic dicarbonyl compound and an aromatic diamine are copolymerized, in the molecular structure, the weight average molecular weight measured by GPC is preferably, for example, 200,000 or more and 215,000 or less, and the viscosity is preferably, for example, 2400 poise or more and 2600 poise or less.

The polyamideimide may be obtained by imidizing a polyamideimide precursor. Also, a polyamideimide film may be obtained using the polyamideimide. For a method for imidizing the polyamideimide precursor and a method for producing a polyamideimide film, JP-A No. 2018-506611, for example, may be referred.

(2) Glass Substrate

The glass constituting the glass substrate is not particularly limited as long as it has transparency; and examples thereof may include silicate glass and silica glass. Among them, borosilicate glass, aluminosilicate glass, and aluminoborosilicate glass are preferable, and alkali-free glass is more preferable. Examples of the commercial products of the glass substrate may include ultra-thin plate glass G-Leaf from Nippon Electric Glass Co., Ltd., and ultra-thin film glass from Matsunami Glass Ind., Ltd.

Also, the glass constituting the glass substrate is preferably a chemically strengthened glass. The chemically strengthened glass is preferable since it has excellent mechanical strength and may be made thin accordingly. The chemically strengthened glass is typically a glass wherein mechanical properties are strengthened by a chemical method by partially exchanging ionic species, such as by replacing sodium with potassium, in the vicinity of the surface of glass, and includes a compressive stress layer on the surface.

Examples of the glass constituting the chemically strengthened glass substrate may include aluminosilicate glass, soda-lime glass, borosilicate glass, lead glass, alkali barium glass, and aluminoborosilicate glass.

Examples of the commercial products of the chemically strengthened glass substrate may include Gorilla Glass from Corning Incorporated, and Dragontrail from AGC Inc.

Among the above, as the substrate layer, a polyimide based resin substrate including a polyimide based resin or a glass substrate is preferable. This is because it may be a substrate layer having bending resistance and excellent hardness and transparency.

(3) Constitution of Substrate Layer

The thickness of the substrate layer is not particularly limited as long as it has a thickness capable of having flexibility, and is appropriately selected according to the type of the substrate layer.

The thickness of the resin substrate is preferably, for example, 10 μm or more and 100 μm or less, and more preferably 25 μm or more and 80 μm or less. When the thickness of the resin substrate is in the above range, excellent flexibility may be obtained, and at the same time, sufficient hardness may be obtained. It is also possible to suppress curling of the stacked body for a flexible display device. Furthermore, it is preferable in terms of reducing the weight of the stacked body for a flexible display device.

The thickness of the glass substrate is preferably, for example, 200 μm or less, more preferably 15 μm or more and 100 μm or less, further preferably 20 μm or more and 90 μm or less, and particularly preferably 25 μm or more and 80 μm or less. When the thickness of the glass substrate is in the above range, excellent flexibility may be obtained, and at the same time, sufficient hardness may be obtained. It is also possible to suppress curling of the stacked body for a flexible display device. Furthermore, it is preferable in terms of reducing the weight of the stacked body for a flexible display device.

4. Functional Layer

The stacked body for a flexible display device in the present disclosure may include a functional layer on the antistatic layer surface side of the substrate layer. Examples of the functional layer may include a hard coating layer, antireflection layer, an antiglare layer, a scattering prevention layer, an antifouling layer, and a primer layer.

Also, the functional layer may be a single layer, and may include a plurality of layers. Also, the functional layer may be a layer having a single function, and may include a plurality of layers having functions different from each other.

The arrangement of the functional layer is not particularly limited as long as the functional layer is placed on the antistatic layer surface side of the substrate layer. The functional layer may be placed, for example, between the substrate layer and the antistatic layer, and may be placed on the antistatic layer, on an opposite surface side to the substrate layer. Among the above, the functional layer is preferably placed between the substrate layer and the antistatic layer, that is, the antistatic layer is preferably placed on the outermost surface.

A hard coating layer is hereinafter exemplified as the functional layer.

(1) Hard Coating Layer

The stacked body for a flexible display device in the present disclosure may include a hard coating layer on the antistatic layer surface side of the substrate layer. The hard coating layer is a member to enhance the surface hardness. By placing the hard coating layer, scratch resistance may be improved. Particularly, when the substrate layer is a resin substrate, the scratch resistance may be effectively improved by placing the hard coating layer.

Figure 4:
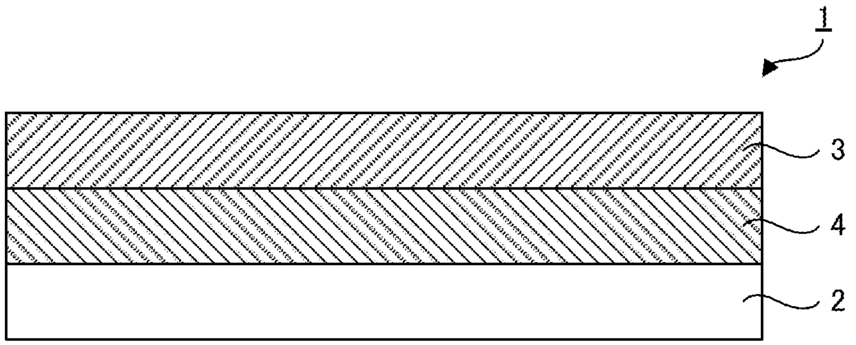
FIG. 4 is a schematic cross-sectional view illustrating an example of a stacked body for a flexible display device in the present disclosure.
Figure 5:
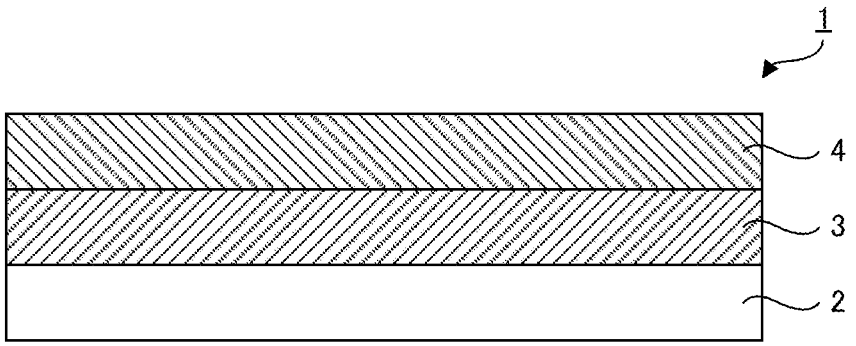
FIG. 5 is a schematic cross-sectional view illustrating an example of a stacked body for a flexible display device in the present disclosure.

The arrangement of the hard coating layer is not particularly limited as long as the hard coating layer is placed on the antistatic layer surface side of the substrate layer. For example, as shown in FIG. 4, the hard coating layer 4 may be placed between the substrate layer 2 and the antistatic layer 3, and as shown in FIG. 5, hard coating layer 4 may be placed on the antistatic layer 3, on an opposite surface side to the substrate layer 2. Among the above, the hard coating layer is preferably placed between the substrate layer and the antistatic layer, that is, the antistatic layer is preferably placed on the outermost surface.

As a material of the hard coating layer, for example, an organic material, an inorganic material, and an organic-inorganic composite material may be used.

Among the above, the material of the hard coating layer is preferably an organic material. Specifically, the hard coating layer preferably include a cured product of a resin composition including a polymerizable compound. The cured product of a resin composition including a polymerizable compound may be obtained by carrying out a polymerization reaction of a polymerizable compound, by a known method using a polymerization initiator if necessary.

The polymerizable compound includes at least one polymerizable functional group in the molecule. As the polymerizable compound, for example, at least one kind of radical polymerizable compound and cation polymerizable compound may be used.

The radical polymerizable compound is a compound including a radical polymerizable group. The radical polymerizable group included in the radical polymerizable compound may be any functional group capable of generating a radical polymerization reaction, and is not particularly limited; and examples thereof may include a group including a carbon-carbon unsaturated double bond, and specific examples thereof may include a vinyl group and a (meth) acryloyl group. Incidentally, when the radical polymerizable compound includes two or more radical polymerizable groups, these radical polymerizable groups may be the same, and may be different from each other.

The number of radical polymerizable groups included in one molecule of the radical polymerizable compound is preferably two or more, and more preferably three or more, from the viewpoint of increasing the hardness of the hard coating layer.

Among the above, from the viewpoint of high reactivity, the radical polymerizable compound is preferably a compound including a (meth) acryloyl group. For example, a polyfunctional (meth) acrylate monomer and oligomer having a molecular weight of several hundred to several thousand, and including several (meth) acryloyl groups in the molecule may be preferably used; such as those referred to as urethane (meth)acrylate, polyester (meth)acrylate, epoxy (meth)acrylate, melamine (meth) acrylate, polyfluoroalkyl (meth) acrylate, and silicone (meth)acrylate; and a polyfunctional (meth) acrylate polymer including two or more (meth) acryloyl groups on the side chain of an acrylate polymer may also be preferably used. Among the above, a polyfunctional (meth) acrylate monomer including two or more (meth) acryloyl groups in one molecule may be preferably used. By the hard coating layer including a cured product of the polyfunctional (meth) acrylate monomer, the hardness of the hard coating layer may be increased, and further, the close adhesiveness may also be improved. Also, a polyfunctional (meth) acrylate oligomer or polymer including two or more (meth) acryloyl groups in one molecule may also be preferably used. By the hard coating layer including a cured product of the polyfunctional (meth) acrylate oligomer or polymer, the hardness and the bending resistance of the hard coating layer may be increased, and further, the close adhesiveness may also be improved.

Incidentally, in the present specification, (meth) acryloyl represents each of acryloyl and methacryloyl, and (meth) acrylate represents each of acrylate and methacrylate.

Specific examples of the polyfunctional (meth)acrylate monomer may include those described in, for example, JP-A No. 2019-132930. Among them, those having 3 or more and 6 or less (meth)acryloyl groups in one molecule are preferable from the viewpoint of high reactivity, improvement of the hardness of the hard coating layer, and the close adhesiveness. For example, pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca (meth)acrylate may be preferably used. In particular, at least one kind selected from pentaerythritol tri(meth)acrylate, dipentaerythritol penta(meth)acrylate, dipentaerythritol hexaacrylate, and PO, EO or caprolactone modified product of the above examples is preferable.

In order to adjust the hardness or viscosity, or to improve the close adhesiveness, the resin composition may include a monofunctional (meth) acrylate monomer as the radical polymerizable compound. Specific examples of the monofunctional (meth) acrylate monomer may include those described in, for example, Japanese Patent Application Laid-Open (JP-A) No. 2019-132930.

The cation polymerizable compound is a compound including a cation polymerizable group. The cation polymerizable group included in the cation polymerizable compound may be a functional group capable of generating a cation polymerization reaction, and is not particularly limited; and examples thereof may include an epoxy group, an oxetanyl group, and a vinyl ether group. Incidentally, when the cation polymerizable compound includes two or more cation polymerizable groups, these cation polymerizable groups may be the same, and may be different from each other.

The number of the cation polymerizable groups included in one molecule of the cation polymerizable compound is preferably two or more, and more preferably three or more, from the viewpoint of improving the hardness of the hard coating layer.

Also, among the above, as a cation polymerizable compound, a compound including at least one kind of an epoxy group and an oxetanyl group as a cation polymerizable group is preferable, and a compound including two or more of at least one kind of an epoxy groups and an oxetanyl groups in one molecule is more preferable. A cyclic ether group such as an epoxy group and an oxetanyl group is preferable from the viewpoint that shrinkage associated with the polymerization reaction is small. Also, a compound including the epoxy group among the cyclic ether groups has advantages in that compounds having various structure may be easily obtained; the durability of the obtained hard coating layer is not adversely affected; and the compatibility with the radical polymerizable compound may be easily controlled. Also, the oxetanyl group among the cyclic ether groups has advantaged in that the degree of polymerization is high compared with the epoxy group; the toxicity is low; and when the obtained hard coating layer is combined with a compound including an epoxy group, the network forming rate obtained from the cationic polymerizable compound in the coating film is accelerated, and an independent network is formed without leaving unreacted monomers in the film even in a region mixed with the radical polymerizable compound.

Examples of the cationic polymerizable compound including an epoxy group may include an alicyclic epoxy resins such as polyglycidyl ether of a polyhydric alcohol including an alicyclic ring, or resins obtained by epoxidizing a compound including a cyclohexene ring or a cyclopentene ring, with a suitable oxidizing agent such as hydrogen peroxide and a peracid; an aliphatic epoxy resins such as polyglycidyl ether of aliphatic polyhydric alcohol or alkylene oxide adduct thereof, polyglycidyl ester of aliphatic long-chain polybasic acid, or homopolymer or copolymer of glycidyl (meth)acrylate; a glycidyl ether type epoxy resin such as glycidyl ether produced by the reaction of bisphenols such as bisphenol A, bisphenol F, and hydrogenated bisphenol A, or derivative thereof such as alkylene oxide adduct and caprolactone adduct with epichlorohydrin, and resins that is novolac epoxy resin and derived from bisphenols.

Specific examples of the cationic polymerizable compound including the alicyclic epoxy resin, the glycidyl ether type epoxy resin, and an oxetanyl group may include those described in, for example, JP-A No. 2018-104682.

The resin composition may include a polymerization initiator if necessary. The polymerization initiator may be used by appropriately selecting from, for example, a radical polymerization initiator, a cation polymerization initiator, and a radical and cation polymerization initiator. These polymerization initiators are decomposed by at least one kind of light irradiation and heating to generate radicals or cations to cause radical polymerization and cation polymerization to proceed. Incidentally, all of the polymerization initiator may be decomposed and may not be left in the hard coating layer, in some cases.

The hard coating layer may further include an additive if necessary. The additive is appropriately selected according to the function imparted to the hard coating layer, and is not particularly limited. Examples thereof may include an inorganic particle, an organic particle, an ultraviolet absorber, an infrared absorber, an antifoulant, an antiglare agent, an antistatic agent, a leveling agent, a surfactant, an easy lubricant, various sensitizers, a flame retardant, an adhesive imparting agent, a polymerization inhibitor, an antioxidant, a light stabilizer, and a surface modifier.

The thickness of the hard coating layer may be appropriately selected according to the function of the hard coating layer and the use application of the stacked body for a flexible display device. The thickness of the hard coating layer is preferably, for example, 0.5 μm or more and 50 μm or less, more preferably 1.0 μm or more and 40 μm or less, further preferably 1.5 μm or more and 30 μm or less, and particularly preferably 2 μm or more and 20 μm or less. When the thickness of hard coating layer is in the above range, sufficient hardness as the hard coating layer may be obtained.

Examples of a method for forming a hard coating layer may include a method wherein the substrate layer or the antistatic layer is coated with a composition for a hard coating layer including the polymerizable compound, and cured.

5. Impact Absorbing Layer

The stacked body for a flexible display device in the present disclosure may include an impact absorbing layer on the substrate layer, on an opposite surface side to the antistatic layer, or between the substrate layer and the antistatic layer. By placing the impact absorbing layer, when an impact is imparted to the stacked body for a flexible display device, the impact is absorbed so that the impact resistance may be improved. Also, when the substrate layer is a glass substrate, the crack of the glass substrate may be suppressed.

The material of the impact absorbing layer is not particularly limited as long as it is capable of obtaining an impact absorbing layer having an impact absorbing property, and transparency, and examples thereof may include polyethylene terephthalate (PET), polyethylene naphthalate (PEN), urethane resin, epoxy resin, polyimide, polyamideimide, acrylic resin, triacetyl cellulose (TAC), and silicone resin. One kind of these materials may be used alone, and two kinds or more may be used in combination.

The impact absorbing layer may further include an additive if necessary. Examples of the additive may include an inorganic particle, an organic particle, an ultraviolet absorber, an antioxidant, a light stabilizer, a surfactant, and an adhesive improving agent.

The impact absorbing layer may be placed on the surface of the substrate layer, on an opposite surface side to the antistatic layer, and may be placed between the substrate layer and the antistatic layer.

The thickness of the impact absorbing layer may be the thickness capable of absorbing an impact, and is preferably, for example, 5 μm or more and 150 μm or less, more preferably 10 μm or more and 120 μm or less, and further preferably 15 μm or more and 100 μm or less.

As the impact absorbing layer, for example, a resin film may be used. Also, for example, the impact absorbing layer may be formed by coating the substrate layer with a composition for an impact absorbing layer.

6. Adhesive Layer for Adhesion

Figure 6:
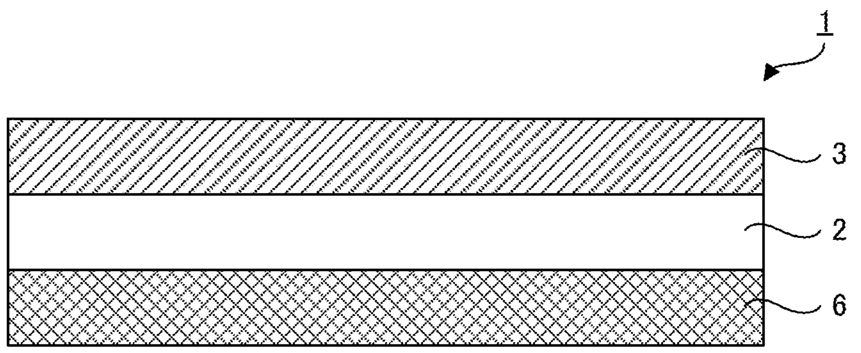
FIG. 6 is a schematic cross-sectional view illustrating an example of a stacked body for a flexible display device in the present disclosure.

For example, as shown in FIG. 6, the stacked body for a flexible display device in the present disclosure may include adhesive layer for adhesion 6 on the substrate layer 2, on an opposite surface side to the antistatic layer 3. The stacked body for a flexible display device may be adhered to, for example, a display panel via the adhesive layer for adhesion.

The adhesive used for the adhesive layer for adhesion is not particularly limited as long as it is an adhesive having transparency, and is capable of adhering the stacked body for a flexible display device to, for example, a display panel. Examples thereof may include a thermosetting adhesive, an ultraviolet curable adhesive, a two-component curable adhesive, a thermal fusion adhesive, and a pressure-sensitive adhesive (so-called tackiness agent).

Examples of the pressure-sensitive adhesive used for the pressure-sensitive adhesive layer may include an acrylic based pressure-sensitive adhesive, a silicone based pressure-sensitive adhesive, a rubber based pressure-sensitive adhesive, and a urethane based pressure-sensitive adhesive, and may be appropriately selected according to the material of the impact absorbing layer. Among the above, an acrylic based pressure-sensitive adhesive is preferable because of excellent transparency, weather resistance, durability, and heat resistance, and low cost.

The thickness of the adhesive layer for adhesion is preferably, for example, 10 μm or more and 100 μm or less, more preferably 25 μm or more and 80 μm or less, and further preferably 40 μm or more and 60 μm or less. When the thickness of the adhesive layer for adhesion is too thin, the stacked body for a flexible display device and the display panel may not be adhered sufficiently. Also, when the adhesive layer for adhesion is a pressure-sensitive adhesive layer, if the thickness of the adhesive layer for adhesion is too thin, the effect of making the impact absorbing layer to be easily deformed, when an impact is imparted to the stacked body for a flexible display device, may not be obtained sufficiently. Meanwhile, when the thickness of the adhesive layer for adhesion is too thick, the flexibility may be deteriorated.

As the adhesive layer for adhesion, for example, an adhesive film may be used. Also, for example, the adhesive layer for adhesion may be formed by coating a supporting body or the substrate layer, for example, with an adhesive composition.

7. Interlayer Adhesive Layer

In the stacked body for a flexible display device in the present disclosure, an interlayer adhesive layer may be placed between each layer.

The adhesive used for the interlayer adhesive layer may be similar to the adhesive used for the adhesive layer for adhesion.

Among the above, as described above, when the impact absorbing layer is placed on the substrate layer, on the opposite surface side to the antistatic layer; the adhesive layer for adhesion is placed on the impact absorbing layer, on the opposite surface side to the substrate layer; and the interlayer adhesive layer is placed between the substate layer and the impact absorbing layer, the adhesive layer for adhesion and the interlayer adhesive layer preferably include the pressure-sensitive adhesive, that is, they are preferably pressure-sensitive adhesive layers.

The pressure-sensitive adhesive layer may be similar to the pressure-sensitive adhesive layer used for the adhesive layer for adhesion.

The thickness of the interlayer adhesive layer, and the forming method, for example, may be similar to the thickness, and the forming method, for example, of the adhesive layer for adhesion.

8. Use Application of Stacked Body for Flexible Display Device

The stacked body for a flexible display device in the present disclosure may be used as a front panel placed on the observer side than the display panel in a flexible display device. Among the above, since the abrasion resistance at bent portion may be improved, the stacked body for a flexible display device in the present disclosure may be preferably used as a front panel in a flexible display device such as a foldable display, a rollable display, and a bendable display, and may further be preferably used as a front panel in a foldable display.

Also, the stacked body for a flexible display device in the present disclosure may be used as a front panel in a display device such as smart phones, tablet terminals, wearable terminals, personal computers, televisions, digital signages, public information displays (PIDs), and car mounted displays.

B. Stacked Body for Display Device

The stacked body for a display device in the present disclosure comprises a substrate layer, and an antistatic layer, wherein a surface resistance of an antistatic layer side surface of the stacked body for a display device is $9\times10^{13}\Omega/\square$ or less; and a surface resistance of the antistatic layer side surface of the stacked body for a display device after an eraser test is $9\times10^{13}\Omega/\square$ or less, wherein, in the eraser test, the antistatic layer side surface of the stacked body for a display device is rubbed with a 6 mm diameter eraser, for 2500 strokes, applying a load of 9.8 N.

Since the details of the stacked body for a display device in the present disclosure may be similar to the stacked body for a flexible display device described above, the explanation is omitted herein.

C. Flexible Display Device

The flexible display device in the present disclosure comprises: a display panel, and the stacked body for a flexible display device described above placed on an observer side of the display panel.

Figure 7:
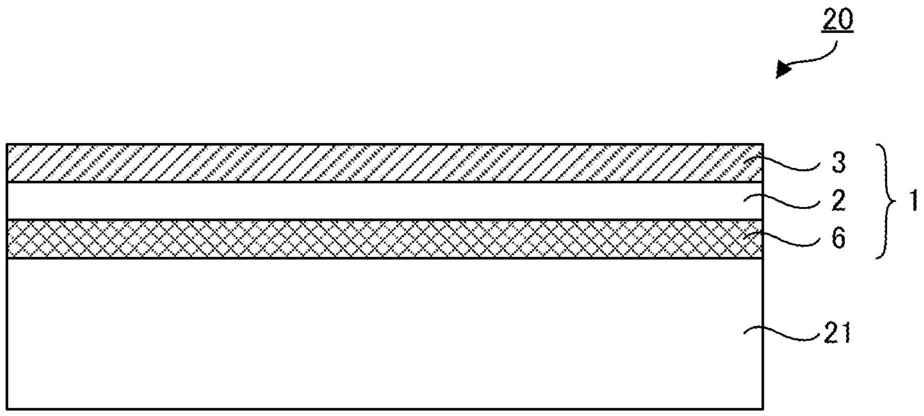
FIG. 7 is a schematic cross-sectional view illustrating an example of a flexible display device in the present disclosure.

FIG. 7 is a schematic cross-sectional view illustrating an example of a flexible display device in the present disclosure. As shown in FIG. 7, flexible display device 20 comprises display panel 21, and the stacked body for a flexible display device 1 placed on an observer side of the display panel 21. In the flexible display device 20, the stacked body for a flexible display device 1 and the display panel 21 may be adhered via, for example, the adhesive layer for adhesion 6 of the stacked body for a flexible display device 1.

When the stacked body for a flexible display device in the present disclosure is placed on the surface of the flexible display device, it is preferably placed so that the antistatic layer is on the outer side, and the substrate layer is on the inner side.

The method for placing the stacked body for a flexible display device in the present disclosure on the surface of the flexible display device is not particularly limited, and examples thereof may include a method via an adhesive layer.

Examples of the display panel in the present disclosure may include a display panel used for a display device such as an organic EL display device, and a liquid crystal display device.

The flexible display device in the present disclosure may include a touch-sensitive panel member between the display panel and the stacked body for a flexible display device.

The flexible display device in the present disclosure is preferably foldable. That is, the flexible display device in the present disclosure is preferably a foldable display.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Example 1

Firstly, composition for an antistatic layer 1 was obtained by compounding each component so as to be the composition shown below.

(Composition of Composition for Antistatic Layer 1)

- Urethane acrylate (product name "UV-7650B" from Mitsubishi Chemical Corporation): 100 parts by mass (solid content 100% conversion value)
- Polymerization initiator (1-hydroxycyclohexylphenyl ketone, product name "Omnirad184", from IGM Resins B. V.): 4 parts by mass
- Antifoulant (product name "BYK-UV3500" from BYK-Chemie Japan Co., Ltd.): 0.5 parts by mass (solid content 100% conversion value)
- Antistatic agent (PEDOT containing photocuring type resin composition, product name "Beamset MT-2" from Arakawa Chemical Industries, Ltd.): 5 parts by mass (solid content 100% conversion value)
- Methyl isobutyl ketone: 250 parts by mass Then, as a substrate layer, a polyimide based resin substrate (product name "Neopulim" from Mitsubishi Gas Chemical Company, Inc.) having a thickness of 50 μm was prepared, and a coating film was formed by applying the composition for an antistatic layer 1 with a bar coater. Thereafter, the coating film was heated at 70° C. for 1 minute to evaporate the solvent in the coating film, and the coating film was cured by irradiating ultraviolet rays with an ultraviolet ray irradiation device (light source H bulb from Fusion UV Systems Japan K.K) under the condition of an oxygen concentration of 200 ppm or less so that the integrated light amount was 380 mJ/cm$^2$ to form an antistatic layer with a thickness of 10 μm. Thus, a stacked body including a substrate layer and an antistatic layer was obtained.

Example 2

A stacked body was produced in the same manner as in Example 1 except that the following composition for an antistatic layer 2 was used.

(Composition of Composition for Antistatic Layer 2)

- Polymerization initiator (1-hydroxycyclohexylphenyl ketone, product name "Omnirad184", from IGM Resins B. V.): 4 parts by mass
- Antifoulant (product name "BYK-UV3500" from BYK-Chemie Japan Co., Ltd.): 0.5 parts by mass (solid content 100% conversion value)
- Antistatic agent (Li salt containing photocuring type resin composition, product name "Beamset 1604" from Arakawa Chemical Industries, Ltd.): 100 parts by mass (solid content 100% conversion value)
- Methyl isobutyl ketone: 240 parts by mass

Example 3

A stacked body was produced in the same manner as in Example 1 except that the following composition for an antistatic layer 3 was used.

(Composition of Composition for Antistatic Layer 3)

- Urethane acrylate (product name "UV-7650B" from Mitsubishi Chemical Corporation): 100 parts by mass (solid content 100% conversion value)
- Polymerization initiator (1-hydroxycyclohexylphenyl ketone, product name "Omnirad184", from IGM Resins B. V.): 4 parts by mass
- Antifoulant (product name "BYK-UV3500" from BYK-Chemie Japan Co., Ltd.): 0.5 parts by mass (solid content 100% conversion value)
- Antistatic agent (quaternary ammonium salt containing polymer type antistatic agent, product name "1SX-1090" from Taisei Fine Chemical Co., Ltd.): 20 parts by mass (solid content 100% conversion value)
- Methyl isobutyl ketone: 290 parts by mass

Example 4

A stacked body was produced in the same manner as in Example 1 except that the following composition for an antistatic layer 4 was used.

(Composition of Composition for Antistatic Layer 4)

- Urethane acrylate (product name "UV-7650B" from Mitsubishi Chemical Corporation): 100 parts by mass (solid content 100% conversion value)
- Polymerization initiator (1-hydroxycyclohexylphenyl ketone, product name "Omnirad184", from IGM Resins B. V.): 4 parts by mass
- Antifoulant (product name "BYK-UV3500" from BYK-Chemie Japan Co., Ltd.): 0.5 parts by mass (solid content 100% conversion value)
- Antistatic agent (PEDOT containing photocuring type resin composition, product name "Beamset MT-2" from Arakawa Chemical Industries, Ltd.): 4 parts by mass (solid content 100% conversion value)
- Methyl isobutyl ketone: 250 parts by mass

Example 5

A stacked body was produced in the same manner as in Example 1 except that the following composition for an antistatic layer 5 was used.

(Composition of Composition for Antistatic Layer 5)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (Li salt containing photocuring type resin composition, product name "Beamset 1604" from Arakawa Chemical Industries, Ltd.): 75 parts by mass (solid content 100% conversion value)

Methyl isobutyl ketone: 240 parts by mass

Example 6

A stacked body was produced in the same manner as in Example 1 except that the following composition for an antistatic layer 6 was used.

(Composition of Composition for Antistatic Layer 6)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (quaternary ammonium salt containing polymer type antistatic agent, product name "1SX-1090" from Taisei Fine Chemical Co., Ltd.): 10 parts by mass (solid content 100% conversion value)

Methyl isobutyl ketone: 290 parts by mass

Example 7

A stacked body was produced in the same manner as in Example 1 except that the following composition for an antistatic layer 7 was used.

(Composition of Composition for Antistatic Layer 7)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (ATO particle dispersion liquid, product name "ELECOM V-3560" from JGC Catalysts and Chemicals Ltd.): 15 parts by mass (solid content 100% conversion value)

Methyl isobutyl ketone: 280 parts by mass

Comparative Example 1

A stacked body was produced in the same manner as in Example 1 except that the following composition for an antistatic layer 8 was used.

(Composition of Composition for Antistatic Layer 8)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (PEDOT containing photocuring type resin composition, product name "Beamset MT-2" from Arakawa Chemical Industries, Ltd.): 2.5 parts by mass (solid content 100% conversion value)

Methyl isobutyl ketone: 250 parts by mass

Comparative Example 2

A stacked body was produced in the same manner as in Example 1 except that the following composition for an antistatic layer 9 was used.

(Composition of Composition for Antistatic Layer 9)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (Li salt containing photocuring type resin composition, product name "Beamset 1604" from Arakawa Chemical Industries, Ltd.): 30 parts by mass (solid content 100% conversion value)

Methyl isobutyl ketone: 240 parts by mass

Comparative Example 3

A stacked body was produced in the same manner as in Example 1 except that the following composition for an antistatic layer 10 was used.

(Composition of Composition for Antistatic Layer 10)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (quaternary ammonium salt containing polymer type antistatic agent, product name "1SX-1090" from Taisei Fine Chemical Co., Ltd.): 4 parts by mass (solid content 100% conversion value)

Methyl isobutyl ketone: 290 parts by mass

Comparative Example 4

A stacked body was produced in the same manner as in Example 1 except that the following composition for an antistatic layer 11 was used.

(Composition of Composition for Antistatic Layer 11)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Antistatic agent (ATO particle dispersion liquid, product name "ELECOM V-3560" from JGC Catalysts and Chemicals Ltd.): 10 parts by mass (solid content 100% conversion value)

Methyl isobutyl ketone: 280 parts by mass

Comparative Example 5

A stacked body was produced in the same manner as in Example 1 except that the following composition for an antistatic layer 12 was used.

(Composition of Composition for Antistatic Layer 12)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Methyl isobutyl ketone: 240 parts by mass

Comparative Example 6

A stacked body was produced in the same manner as in Example 1 except that the following composition for an antistatic layer 13 was used.

(Composition of Composition for Antistatic Layer 13)

Urethane acrylate (product name "UV-7650B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3510" from BYK-Chemie Japan Co., Ltd.): 0.5 parts by mass (solid content 100% conversion value)

Methyl isobutyl ketone: 240 parts by mass

Comparative Example 7

A stacked body was produced in the same manner as in Example 1 except that the following composition for an antistatic layer 14 was used.

(Composition of Composition for Antistatic Layer 14)

Urethane acrylate (product name "UV-7600B" from Mitsubishi Chemical Corporation): 100 parts by mass (solid content 100% conversion value)

Polymerization initiator (1-hydroxycyclohexylphenyl ketone, product name "Omnirad184", from IGM Resins B. V.): 4 parts by mass Antifoulant (product name "BYK-UV3500" from BYK-Chemie Japan Co., Ltd.): 0.5 parts by mass (solid content 100% conversion value)

Methyl isobutyl ketone: 240 parts by mass

[Evaluation]

(1) Surface Resistance Before and After Eraser Test

The following eraser test was carried out to the antistatic layer side surface of the stacked body in Examples and Comparative Examples, and the surface resistance of the antistatic layer side surface of the stacked body before and after the eraser test was measured.

Firstly, in the eraser test, a stacked body having a size of 15 cm×10 cm was prepared. Then, the eraser test was carried out to the antistatic layer side surface of the stacked body. Specifically, using a 6 mm diameter eraser from Minoan Co., Ltd., the eraser was inserted into a jig provided with a 6 mm diameter hole so that 4 mm of the tip of the eraser was exposed from the jig, the jig with the eraser was installed into a color fastness rubbing tester (tradename "AB-301" from Tester Sangyo Co., Ltd.), and the antistatic layer side surface of the stacked body was rubbed for 2500 strokes, with the eraser, applying a load of 9.8 N, at traveling speed of 80 mm/sec, and traveling distance of 40 mm.

Then, for the eraser tested portion and the eraser test-untested portion of the antistatic layer side surface of the stacked body, the surface resistance was measured. When measuring the surface resistance, the measurement was carried out after leaving the stacked body to stand for 1 hour under environment of temperature of 23±2° C., and humidity of 50±10%. The surface resistance was measured by using a resistivity meter (Hiresta-UX MCP-HT type from Nittoseiki Analytech Co., Ltd.), using MCP-HTO14 URS probe for the eraser tested portion, using MCP-HTP11 UA probe for the eraser test-untested portion, and at applied voltage of 1000 V. For the eraser tested portion and the eraser test-untested portion of the antistatic layer side surface of the stacked body, the surface resistance was measured at ten places for the respective portions, and the arithmetic average value of the measurement value of the ten places was regarded as the surface resistance.

(2) Sliding Property Before and After Eraser Test

The eraser test described below was carried out to the antistatic layer side surface of the stacked body in Examples and Comparative Examples, and the sliding property of the antistatic layer side surface of the stacked body before and after the eraser test was evaluated.

The eraser test was carried out in the same manner as the above.

Then, the sliding property at the eraser tested portion and the eraser test-untested portion, of the antistatic layer side surface of the stacked body, was evaluated. Specifically, the antistatic layer side surface of the stacked body was rubbed with a fingertip in the order of the eraser test-untested portion, the eraser tested portion, and the eraser test-untested portion at traveling speed of 10 cm/sec, and the sliding property at the eraser tested portion at that time was evaluated based on the following criteria.

A: 7 or more out of 10 people did not feel scratchy

B: 5 or 6 out of 10 people did not feel scratchy

C: 6 or 7 out of 10 people felt scratchy

D: 8 or more out of 10 people felt scratchy (3) Friction Force Before and After Eraser Test The eraser test described below was carried out to the antistatic layer side surface of the stacked body in Examples and Comparative Examples, and the friction force with respect to the eraser, of the antistatic layer side surface of the stacked body, before and after the eraser test was measured. Firstly, the eraser test was carried out in the same manner as the above. Then, the friction force with respect to the eraser at the eraser tested portion and the eraser test-untested portion, of the antistatic layer side surface of the stacked body, was measured. Specifically, using a 6 mm diameter eraser from Minoan Co., Ltd., the eraser was inserted into a jig provided with a 6 mm diameter hole so that 4 mm of the tip of the eraser was exposed from the jig, the jig provided with the eraser was installed into a continuous loading scratching intensity tester (tradename "TriboGear Type 18" from Shinto Scientific Co., Ltd.), and the antistatic layer side surface of the stacked body was rubbed with the eraser, applying a load of 1.96 N and at traveling speed of 840 mm/min in the order of eraser test-untested portion, eraser tested portion, and eraser test-untested portion to measure the friction force. In doing so, as shown in FIG. 2, the eraser was moved vertically to the longitudinal direction of the rectangle eraser tested portion 32 as shown with an arrow. And for the friction force with respect to the eraser of the eraser tested portion, the maximum value of the friction force was determined. Also, for the friction force with respect to the eraser in the eraser test-untested portion, as shown in FIG. 2, when the point at which the friction force with respect to the eraser was the maximum in the eraser tested portion 32 was regarded as 0 mm, the average value of the friction force in the eraser test-untested portion 31, in a range of 4.2 mm to 9.8 mm on the basis of the point (0 mm) described above, was determined.

TABLE 1

| | Antistatic agent | | Surface resistance (Ω/□) | | | Avg. of friction force (N) | Max of friction force (N) | | |
|---|---|---|---|---|---|---|---|---|---|
| | Type | Added amount (parts mass) | Preeraser test (eraser test untested portion) | Posteraser test (eraser tested portion) | Ratio of surface resistance | Preeraser test (eraser test untested portion) | Posteraser test (eraser tested portion) | Ratio of friction force | Sliding property |
| Example 1 | PEDOT | 5 | $2.9 \times 10^{12}$ | $4.1 \times 10^{12}$ | 1.4 | 3.69 | 4.81 | 1.30 | A |
| Example 2 | Li salt | 100 | $6.3 \times 10^{12}$ | $8.0 \times 10^{12}$ | 1.3 | 4.37 | 6.41 | 1.47 | A |
| Example 3 | Quaternary ammonium salt cont. polymer antistatic agent | 20 | $8.0 \times 10^{10}$ | $1.1 \times 10^{11}$ | 1.4 | 3.24 | 4.64 | 1.43 | A |
| Example 4 | PEDOT | 4 | $3.7 \times 10^{12}$ | $1.7 \times 10^{13}$ | 4.6 | 4.04 | 5.93 | 1.47 | A |
| Example 5 | Li salt | 75 | $6.6 \times 10^{12}$ | $6.0 \times 10^{13}$ | 9.1 | 4.66 | 6.85 | 1.47 | A |
| Example 6 | Quaternary ammonium salt cont. polymer antistatic agent | 10 | $2.4 \times 10^{12}$ | $4.4 \times 10^{13}$ | 18.3 | 3.85 | 5.69 | 1.48 | A |
| Example 7 | ATO | 15 | $1.3 \times 10^{12}$ | $2.9 \times 10^{13}$ | 22.3 | 4.19 | 6.28 | 1.50 | B |
| Comp. Ex. 1 | PEDOT | 2.5 | $1.5 \times 10^{13}$ | $>10^{14}$ | — | 4.91 | 8.24 | 1.68 | D |
| Comp. Ex. 2 | Li salt | 30 | $3.1 \times 10^{13}$ | $>10^{14}$ | — | 4.93 | 7.93 | 1.61 | C |
| Comp. Ex. 3 | Quaternary ammonium salt cont. polymer antistatic agent | 4 | $1.9 \times 10^{13}$ | $>10^{14}$ | — | 4.94 | 8.64 | 1.75 | D |
| Comp. Ex. 4 | ATO | 10 | $8.3 \times 10^{13}$ | $>10^{14}$ | — | 4.99 | 8.83 | 1.77 | D |
| Comp. Ex. 5 | None | 0 | $>10^{14}$ | $>10^{14}$ | — | 5.06 | 9.12 | 1.80 | D |
| Comp. Ex. 6 | None | 0 | $>10^{14}$ | $>10^{14}$ | — | 5.20 | 9.49 | 1.82 | D |
| Comp. Ex. 7 | None | 0 | $>10^{14}$ | $>10^{14}$ | — | 5.38 | 9.89 | 1.84 | D |

As shown in Table 1, for the samples wherein both of the surface resistances before the eraser test and after the eraser test were $9\times10^{13}$Ω/□ or less (Examples 1 to 7), all of them were excellent in the sliding property. However, the samples wherein either one of the surface resistances before the eraser test and after the eraser test was more than $9\times10^{13}$Ω/□ (Comparative Examples 1 to 7), were inferior in the sliding property evaluation.

Also, the result of the sliding property for the sample wherein the ratio of the surface resistance after the eraser test, with respect to the surface resistance before the eraser test (initial surface resistance) was more than 20.0 (Example 7), was slightly inferior than the samples with the ratio of 20.0 or less.

REFERENCE SIGNS LIST

1: stacked body for a flexible display device
2: substrate layer
3: antistatic layer
4: hard coating layer
5: impact absorbing layer
6: adhesive layer for adhesion
7: interlayer adhesive layer
20: flexible display device
21: display panel

The invention claimed is:

1. A stacked body for a flexible display device comprising a substrate layer, and an antistatic layer, wherein a surface resistance of an antistatic layer side surface of the stacked body for a flexible display device is $9\times10^{13}$Ω/□ or less;

a surface resistance of the antistatic layer side surface of the stacked body for a flexible display device after an eraser test is $9\times10^{13}$Ω/□ or less, wherein, in the eraser test, the antistatic layer side surface of the stacked body for a flexible display device is rubbed with a 6 mm diameter eraser, for 2500 strokes, applying a load of 9.8 N, and a ratio of the surface resistance of the antistatic layer side surface of the stacked body for a flexible display device after the eraser test to the surface resistance of the antistatic layer side surface of the stacked body for a flexible display device before the eraser test is 20.0 or less.

2. The stacked body for a flexible display device according to claim 1, wherein a functional layer is included on an antistatic layer surface side of the substrate layer.

3. The stacked body for a flexible display device according to claim 1, wherein the antistatic layer is placed on an outermost surface.

4. The stacked body for a flexible display device according to claim 1, wherein an impact absorbing layer is included on a surface of the substrate layer, on an opposite surface side to the antistatic layer, or between the substrate layer and the antistatic layer.

5. The stacked body for a flexible display device according to claim 1, wherein an adhesive layer for adhesion is included on a surface of the substrate layer, on an opposite surface side to the antistatic layer.

6. The stacked body for a flexible display device according to claim 1, wherein the ratio is 10.0 or less.

7. The stacked body for a flexible display device according to claim 1, wherein the ratio is 5.0 or less.

8. The stacked body for a flexible display device according to claim 1, wherein a minimum surface resistance value of the antistatic layer side surface of the stacked body for a flexible display device before the eraser test is $2.4\times10^{12}\Omega/\square$.

9. A flexible display device comprising:

a display panel, and the stacked body for a flexible display device according to claim 1 placed on an observer side of the display panel.

10. A stacked body for a display device comprising a substrate layer, and an antistatic layer, wherein a surface resistance of an antistatic layer side surface of the stacked body for a display device is $9\times10^{13}\Omega/\square$ or less;

a surface resistance of the antistatic layer side surface of the stacked body for a display device after an eraser test is $9\times10^{13}\Omega/\square$ or less, wherein, in the eraser test, the antistatic layer side surface of the stacked body for a display device is rubbed with a 6 mm diameter eraser, for 2500 strokes, applying a load of 9.8 N, and a ratio of the surface resistance of the antistatic layer side surface of the stacked body for a display device after the eraser test to the surface resistance of the antistatic layer side surface of the stacked body for a display device before the eraser test is 20.0 or less.

11. The stacked body for a display device according to claim 10, wherein the ratio is 10.0 or less.

12. The stacked body for a display device according to claim 10, wherein the ratio is 5.0 or less.

13. The stacked body for a display device according to claim 10, wherein a minimum surface resistance value of the antistatic layer side surface of the stacked body for a flexible display device before the eraser test is $2.4\times10^{12}\Omega/\square$.

* * * * *